(12) United States Patent
Law et al.

(10) Patent No.: US 9,666,562 B2
(45) Date of Patent: May 30, 2017

(54) 3D INTEGRATED CIRCUIT

(71) Applicant: QUALCOMM Incorporated, San Deigo, CA (US)

(72) Inventors: Oscar Law, San Diego, CA (US); Chunchen Liu, San Diego, CA (US); Ju-Yi Lu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/598,052

(22) Filed: Jan. 15, 2015

(65) Prior Publication Data

US 2016/0211241 A1 Jul. 21, 2016

(51) Int. Cl.
| | |
|---|---|
| *H01L 23/48* | (2006.01) |
| *H01L 25/065* | (2006.01) |
| *H03K 17/00* | (2006.01) |
| *H03K 17/56* | (2006.01) |
| *G11C 29/12* | (2006.01) |
| *G11C 29/48* | (2006.01) |
| *H01L 23/538* | (2006.01) |
| *G01R 31/3185* | (2006.01) |
| *H01L 21/66* | (2006.01) |

(52) U.S. Cl.
CPC .. *H01L 25/0657* (2013.01); *G01R 31/318513* (2013.01); *G11C 29/1201* (2013.01); *G11C 29/48* (2013.01); *H01L 23/5384* (2013.01); *H01L 23/5385* (2013.01); *H03K 17/002* (2013.01); *H03K 17/56* (2013.01); *H01L 22/32* (2013.01); *H01L 2225/06513* (2013.01); *H01L 2225/06541* (2013.01); *H01L 2225/06572* (2013.01); *H01L 2225/06596* (2013.01); *H01L 2924/0002* (2013.01)

(58) Field of Classification Search
CPC ... H01L 25/0657; H03K 17/002; H03K 17/56
See application file for complete search history.

(56) References Cited

U.S. PATENT DOCUMENTS

| | | |
|---|---|---|
| 8,604,603 B2 | 12/2013 | Lau et al. |
| 8,778,734 B2 | 7/2014 | Metsis |
| 2009/0001601 A1* | 1/2009 | Taufique ............... G11O 5/025 257/777 |

(Continued)

OTHER PUBLICATIONS

International Search Report and Written Opinion—PCT/US2015/065103—ISA/EPO—Apr. 4, 2016.

*Primary Examiner* — Shaun Campbell
(74) *Attorney, Agent, or Firm* — Loza & Loza, LLP

(57) ABSTRACT

A three-dimensional integrated circuit (3D-IC) architecture incorporates multiple layers, each layer including at least one die and at least one switch to connect the dies on the different layers. In some aspects, a power distribution network (PDN) is routed from a first layer through the switches to supply power to at least one other layer, thereby reducing routing congestion on the layers. The switches can be placed around the periphery of an IC package to improve heat dissipation (e.g., by improving heat transfer from the center to the edge of the IC package). The switches can be used for routing test signals and/or other signals between layers, thereby improving test functionality and/or fault recovery.

33 Claims, 23 Drawing Sheets

(56) References Cited

U.S. PATENT DOCUMENTS

| | | |
|---|---|---|
| 2010/0091537 A1* | 4/2010 | Best .................. G11C 5/02 365/51 |
| 2012/0250443 A1 | 10/2012 | Saraswat et al. |
| 2013/0120021 A1 | 5/2013 | Chi |
| 2013/0335059 A1* | 12/2013 | Saraswat .............. G05F 1/618 323/355 |
| 2014/0021599 A1 | 1/2014 | Huang |
| 2014/0110711 A1 | 4/2014 | Gorman et al. |
| 2014/0177626 A1 | 6/2014 | Thottethodi et al. |
| 2014/0181417 A1 | 6/2014 | Loh et al. |

* cited by examiner

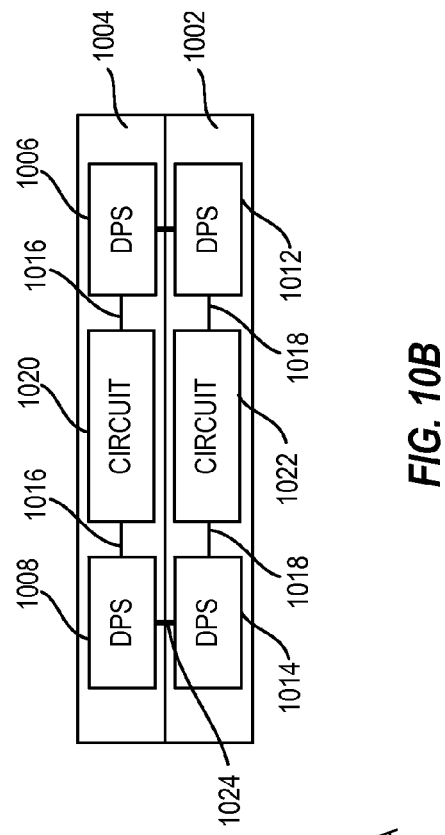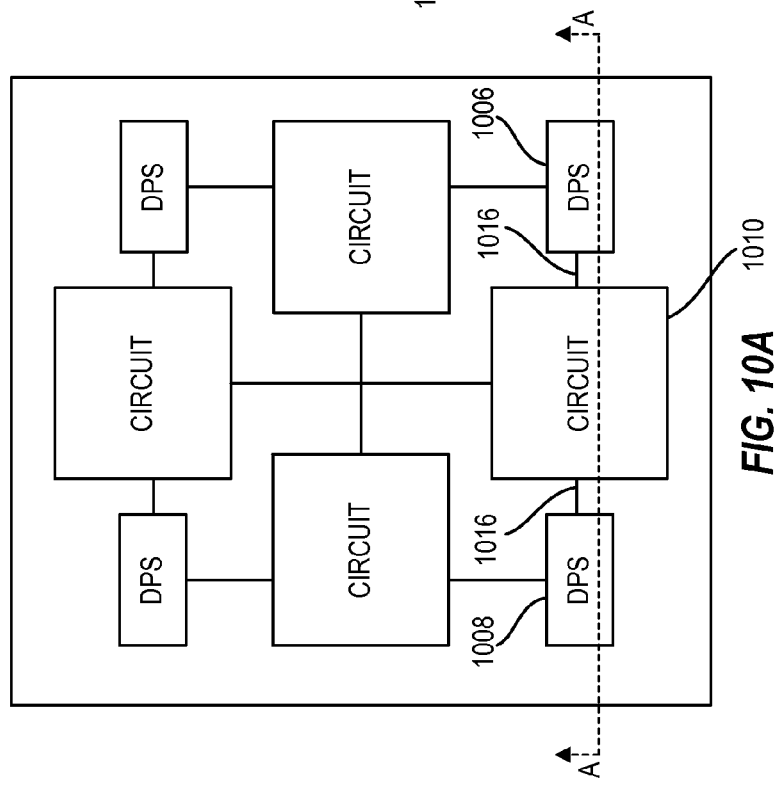

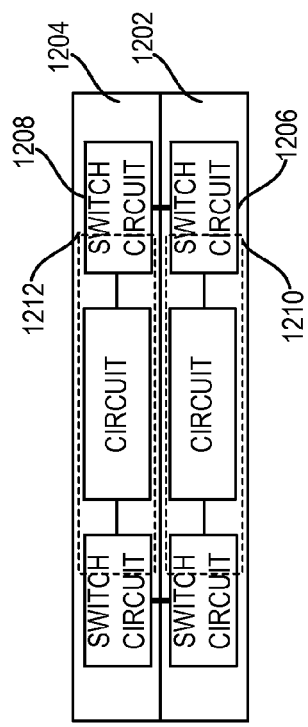
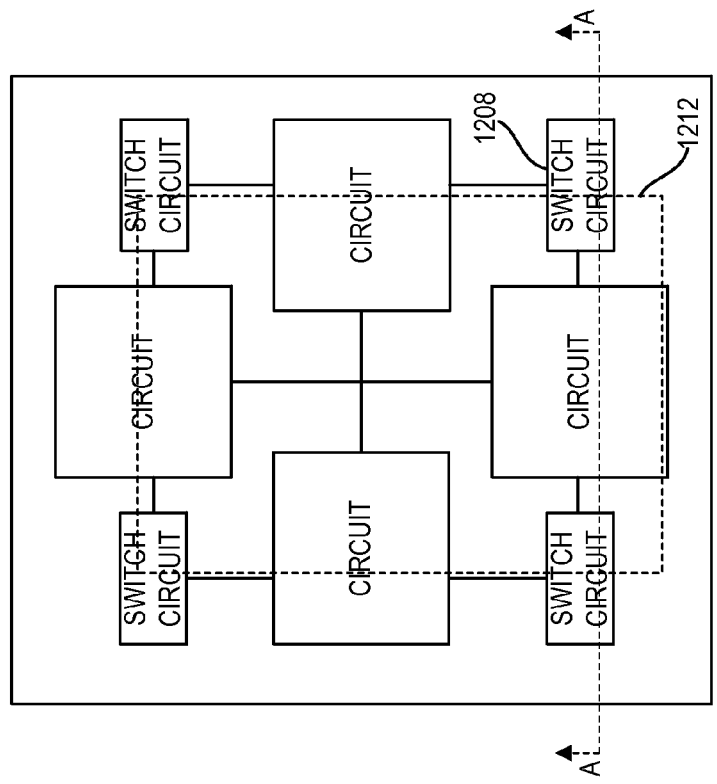
FIG. 12

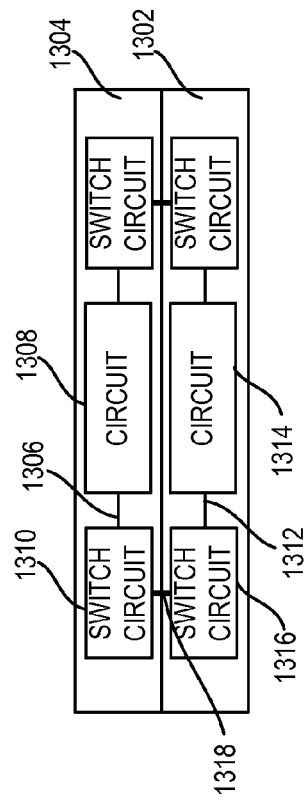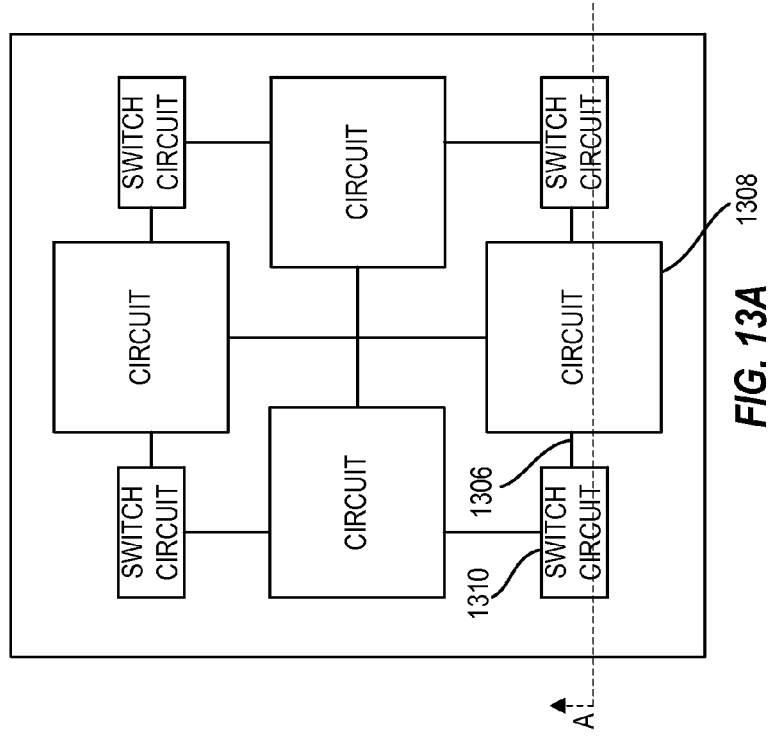
FIG. 13A
FIG. 13B
FIG. 13

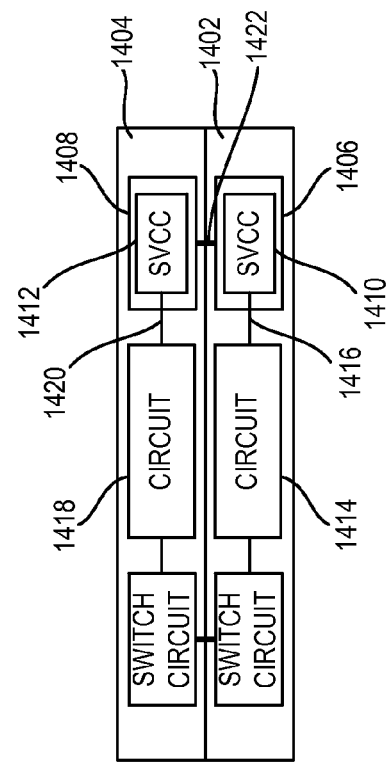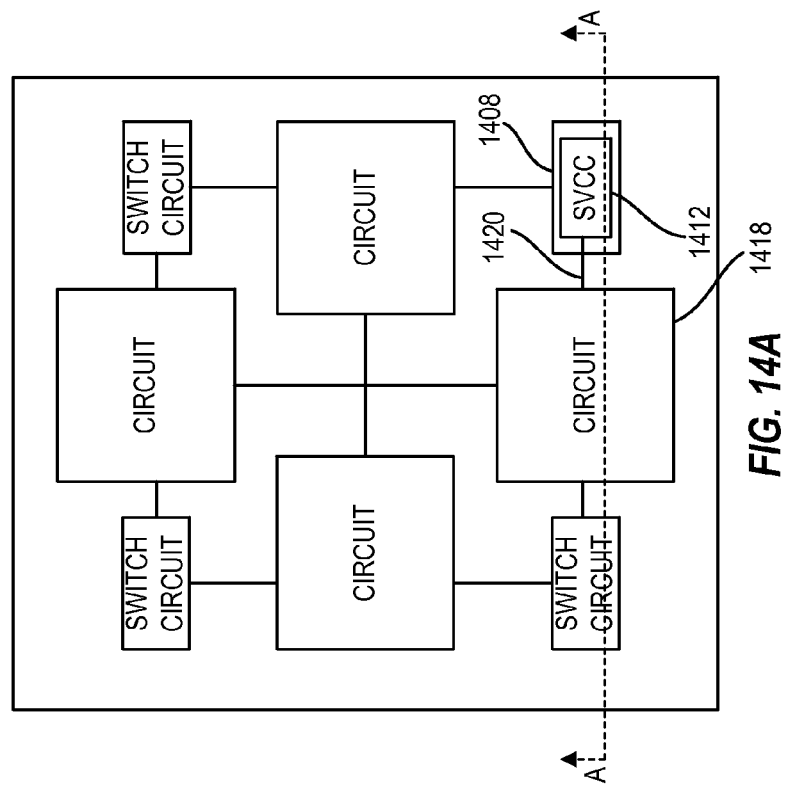
FIG. 14B
FIG. 14A
FIG. 14

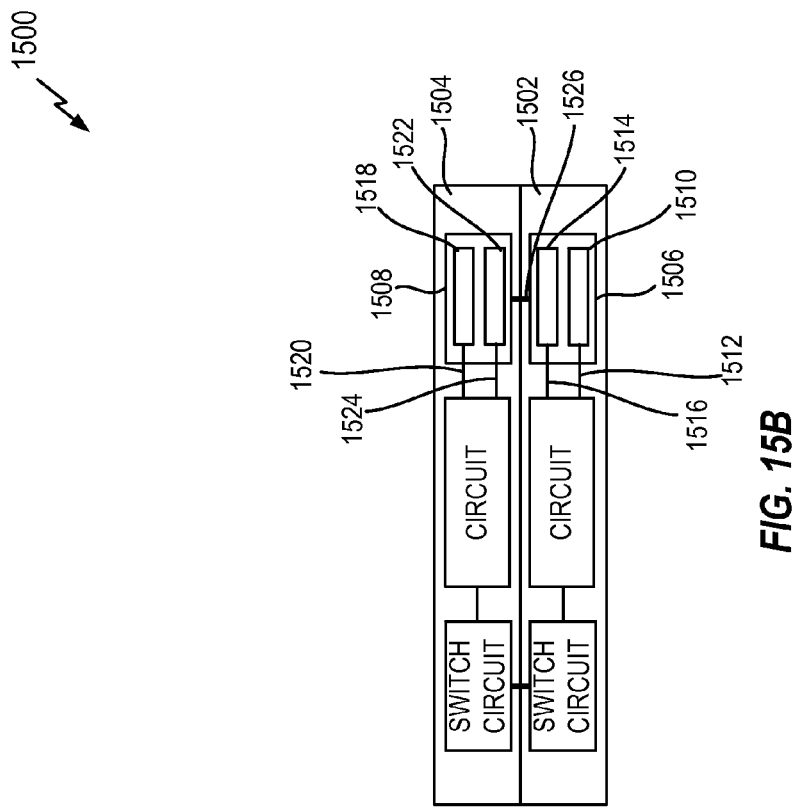
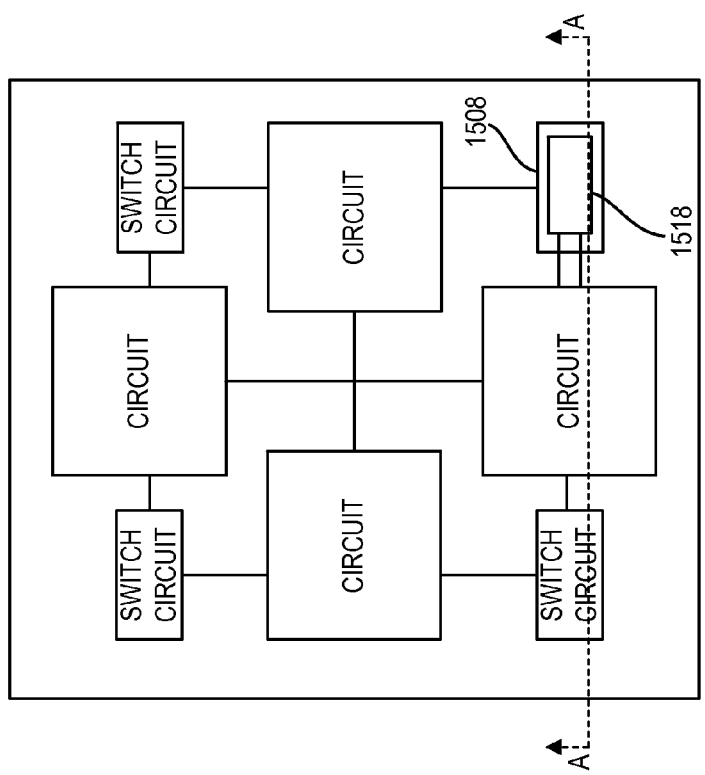
FIG. 15A
FIG. 15B
FIG. 15

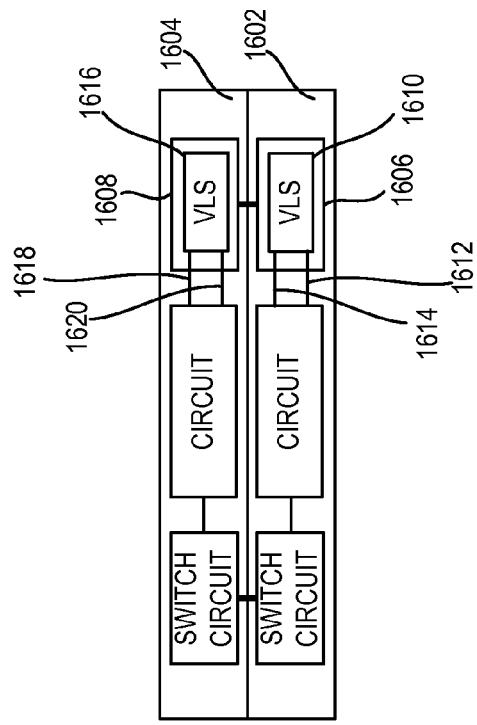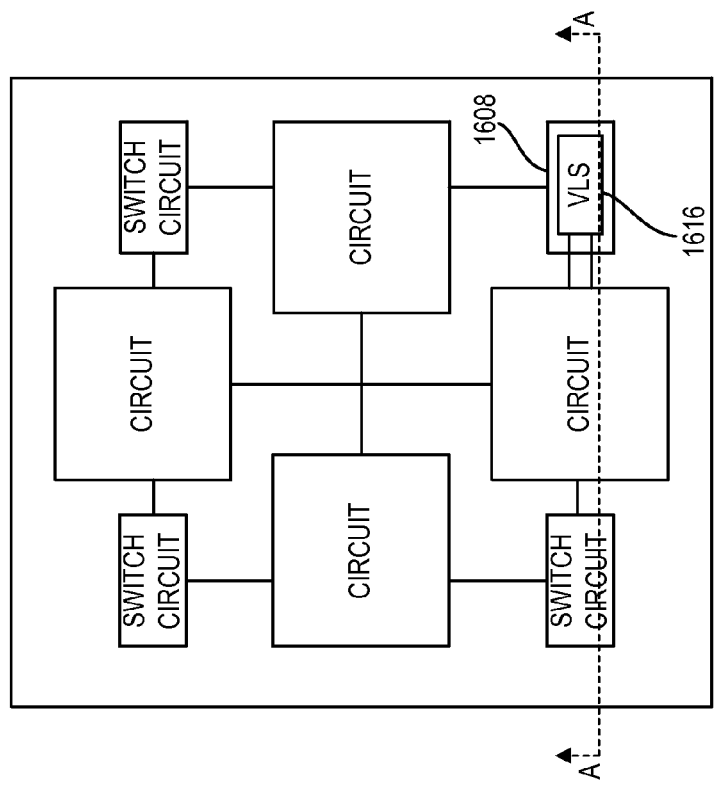
FIG. 16

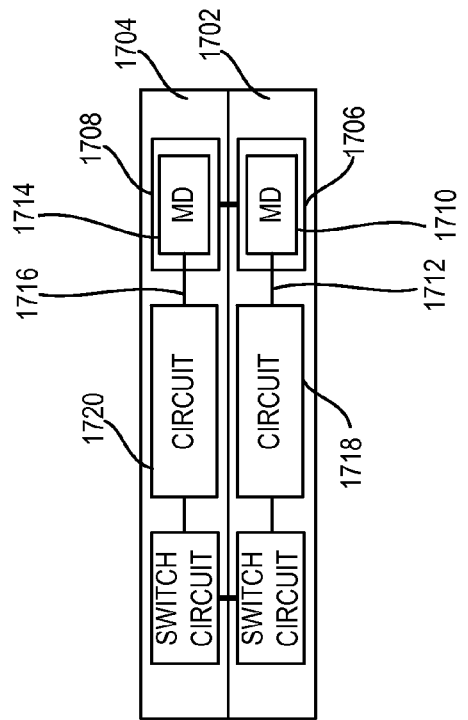
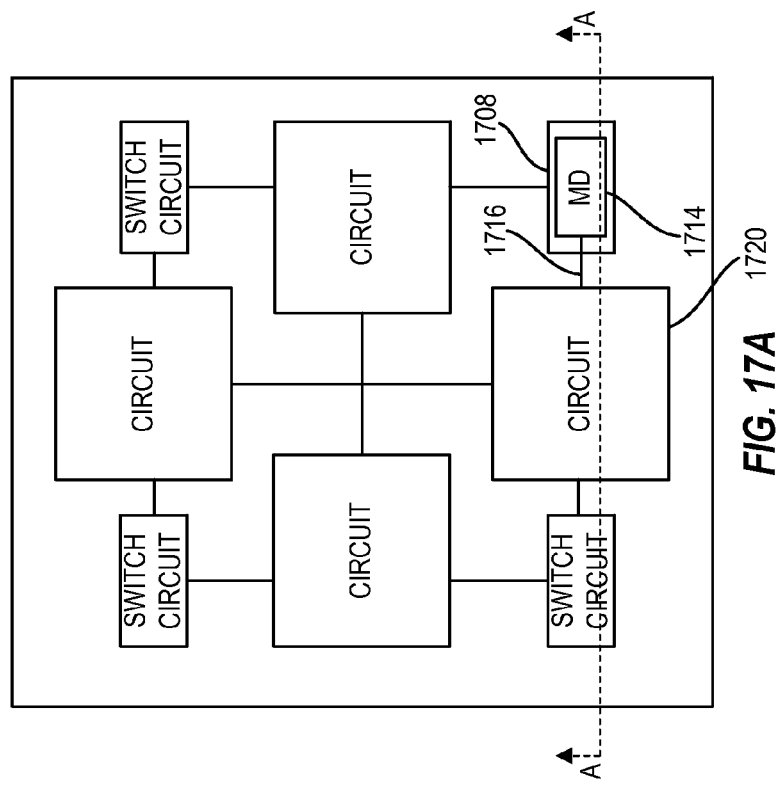
FIG. 17

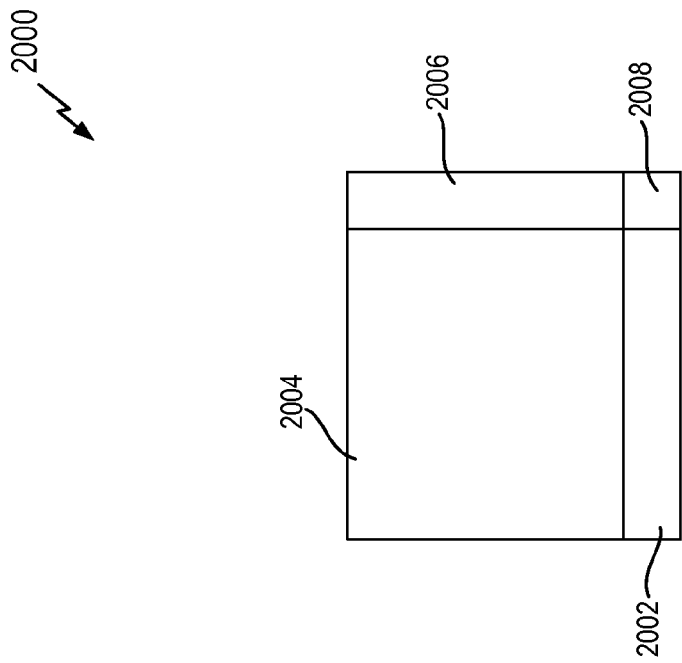
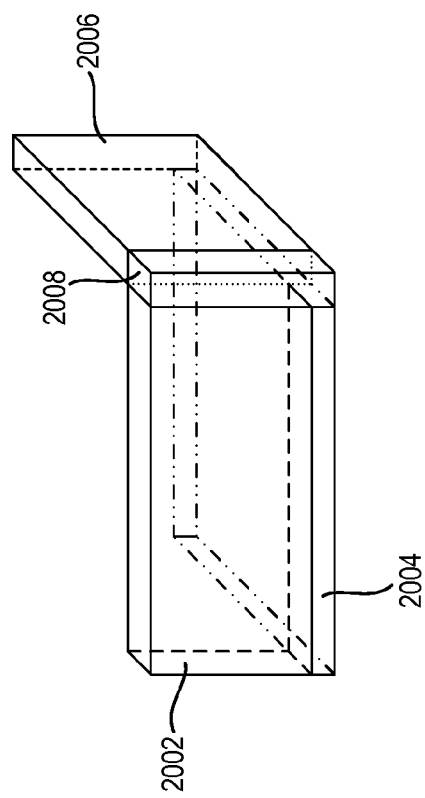
FIG. 20B
FIG. 20
FIG. 20A

3D INTEGRATED CIRCUIT

BACKGROUND

Field of the Disclosure

Aspects of the disclosure relate generally to electronic circuits, and more specifically, but not exclusively, to a three-dimensional (3D) integrated circuit (IC).

Description of Related Art

Conventional 3D integrated circuit (3D-IC) architectures include a so-called 2.5D architecture and a fully stacked 3D architecture. In a 2.5D architecture, dies are placed side-by-side and interconnected via a horizontal interposer layer. A fully stacked 3D architecture employs dies that are stacked on top of one another. Both architectures use through-silicon vias (TSVs) to connect the metal layers.

Existing 3D-IC routing design faces several critical challenges relating to power distribution network (PDN) design, thermal management, and testing methodology. A typical 3D-IC PDN is implemented as a pyramid shape where power rails are used to supply the power from the bottom of the IC to the top of the IC. This PDN occupies significant die area and leads to routing congestion. Regarding thermal management, when multiple dies are stacked together, it is difficult to dissipate the heat, especially for bottom dies. This can lead to a dramatic degradation in overall system performance at high temperatures. Regarding testing, it is difficult (if not impossible in some cases) to fully test dies before packaging. In particular, cross die functionality might not be fully testable before the dies are assembled. Accordingly, there is a need for better testing methodologies for 3D-ICs.

SUMMARY

The following presents a simplified summary of some aspects of the disclosure to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present various concepts of some aspects of the disclosure in a simplified form as a prelude to the more detailed description that is presented later.

Various aspects of the present disclosure provide for a 3D-IC architecture that incorporates dies on different geometric planes and at least one switch on each geometric plane to connect the dies. In this architecture, a PDN can be routed from a first die on one geometric plane through the switches to supply power to at least one other die on at least one other geometric plane. This can significantly reduce the PDN area in the first die (and, potentially, adjacent dies) and mitigate routing congestion problems. Moreover, the switches can be placed around the periphery of the IC package to improve heat dissipation. By placing the switches on the periphery, heat can be transferred more quickly from the center to the edge of the IC package through a redistribution layer (RDL) and TSVs. Also, the switches can be used for routing test signals and/or other signals between dies, thereby improving test functionality and/or fault recovery.

Various aspects of the present disclosure provide for a 3D-IC architecture that incorporates multiple layers, where each layer includes multiple dies, and at least one interposer for wire routing in one dimension (e.g., a horizontal dimension) to connect the dies of a given layer. The 3D-IC architecture further includes at least one switch on each layer for wire routing in another dimension (e.g., a vertical dimension) to connect the dies of different layers. In this architecture, a PDN and/or other wiring can be routed from a first die of one layer through the switches and the interposer(s) to supply power and/or other signals to at least one other die of at least one other layer.

In accordance with the teachings herein, 3D-ICs with TSVs may be used to address advanced semiconductor device scaling problems. Through the use of 3D-ICs, multiple dies with the same and/or different technologies can be integrated into a single IC package. This approach can improve overall system performance and reduce total power consumption, while also offering a cost advantage through the use of a low cost mainstream process, without advanced technology migration.

In one aspect, the disclosure provides an integrated circuit including a first die lying within a first geometric plane and including a first circuit and a first switch circuit, the first switch circuit electrically coupled to the first circuit; and a second die lying within a second geometric plane that is different from the first geometric plane, the second die including a second circuit and a second switch circuit, the second switch circuit electrically coupled to the second circuit and the first switch circuit.

Examples of additional aspects of the disclosure for the integrated circuit follow. In some aspects, the second die is stacked on top of the first die. In some aspects, the first and second switch circuits are each dynamically switchable. In some aspects, the apparatus further includes: a first signal bus of the first die electrically coupled to the first switch circuit; and a second signal bus of the second die electrically coupled to the second switch circuit. In some aspects, the apparatus further includes: a first test signal path of the first die is electrically coupled to the first switch circuit; and a second test signal path of the second die is electrically coupled to the second switch circuit. In some aspects, the first switch circuit includes a first supply voltage control circuit; and the second switch circuit includes a second supply voltage control circuit. In some aspects, each of the first and second supply voltage control circuits generates a plurality of supply voltage levels. In some aspects, the apparatus further includes: a first power distribution path of the first die electrically coupled to the first switch circuit; and a second power distribution path of the second die electrically coupled to the second switch circuit. In some aspects, the first switch circuit includes a first voltage level shifter coupled to a first signal path of the first die; and the second switch circuit includes a second voltage level shifter coupled to a second signal path of the second die. In some aspects, the first switch circuit includes a first memory device coupled to a first signal path of the first die; and the second switch circuit includes a second memory device coupled to a second signal path of the second die. In some aspects, the first switch circuit is located at a first periphery of the first die; and the second switch circuit is located at a second periphery of the second die. In some aspects, the apparatus further includes: a third die lying within a third geometric plane that is different from the first and second geometric planes, the third die including a third circuit and a third switch circuit, the third switch circuit electrically coupled to the third circuit and the first and second switch circuits. In some aspects, the first and second circuits include logic circuits. In some aspects, the first and second switch circuits include analog switch circuitry.

Another aspect of the disclosure provides an integrated circuit including a first interposer layer lying within a first geometric plane; a first die layer stacked on the first interposer layer and including a first die and a second die, the first die including a first circuit, the second die including a first switch circuit, the first switch circuit electrically coupled to the first circuit; a second interposer layer lying within a second geometric plane that is different from the first geometric plane; and a second die layer stacked on the second interposer layer and including a third die and a fourth die, the third die including a second circuit, the fourth die including a second switch circuit, the second switch circuit electrically coupled to the second circuit and the first switch circuit.

Examples of additional aspects of the disclosure for this integrated circuit follow. In some aspects, each of the first and second switch circuits includes a dynamically switchable switch. In some aspects, the second interposer layer is stacked on top of the first die layer. In some aspects, a first signal bus of the first die layer is electrically coupled to the first switch circuit; a second signal bus of the second die layer is electrically coupled to the second switch circuit; and a third signal bus is routed from the first die layer through the second interposer layer to the second die layer, and electrically coupled to the first and second switch circuits. In some aspects, a first test signal path of the first die layer is electrically coupled to the first switch circuit; a second test signal path of the second die layer is electrically coupled to the second switch circuit; and a third test signal path is routed from the first die layer through the second interposer layer to the second die layer, and electrically coupled to the first and second switch circuits. In some aspects, a first power distribution path of the first die layer is electrically coupled to the first switch circuit; and a second power distribution path of the second die layer is electrically coupled to the second switch circuit; and a third power distribution path is routed from the first die layer through the second interposer layer to the second die layer, and electrically coupled to the first and second switch circuits. In some aspects, the first switch circuit includes a first supply voltage control circuit configured to supply at least one first supply voltage to the first circuit; and the second switch circuit includes a second supply voltage control circuit configured to supply at least one second supply voltage to the second circuit. In some aspects, each of the at least one first supply voltage and the at least one second supply voltage includes a plurality of supply voltage levels. In some aspects, the second die is located at a first periphery of the first die layer; and the fourth die is located at a second periphery of the second die layer. In some aspects, the integrated circuit further includes: a third interposer layer lying within a third geometric plane that is different from the first and second geometric planes; and a third die layer stacked on the third interposer layer and including a fifth die and a sixth die, the fifth die including a third circuit, the sixth die including a third switch circuit, the third switch circuit electrically coupled to the third circuit and the first and second switch circuits. In some aspects, the first and second circuits include logic circuits. In some aspects, the first and second switch circuits include analog switch circuitry.

Another aspect of the disclosure provides a method for switching a signal including receiving a signal via a first signal path at a first switch circuit on a first die lying within a first geometric plane; controlling the first switch circuit via a first circuit on the first die to route the signal to a second switch circuit on a second die lying within a second geometric plane that is different from the first geometric plane; and controlling the second switch circuit via a second circuit on the second die to route the signal to a second signal path.

Examples of additional aspects of the disclosure for the method follow. In some aspects, the second die is stacked on top of the first die. In some aspects, the signal includes a test signal. In some aspects, the signal includes a power supply voltage signal. In some aspects, the method further includes: identifying a fault condition on the first die; and triggering the routing of the signal to the second signal path as a result of the identification of the fault condition. In some aspects, the method further includes: controlling the first switch circuit via the first circuit to route the signal to a memory device on the first die as a result of the identification of the fault condition. In some aspects, the method further includes: disabling the first die as a result of the identification of the fault condition. In some aspects, the method further includes: controlling the second switch circuit via the second circuit to route the signal to a third switch circuit on a third die lying within a third geometric plane that is different from the first and second geometric planes; and controlling the third switch circuit via a third circuit on the third die to route the signal to a third signal path. In some aspects, the first and second circuits include logic circuits. In some aspects, the first and second switch circuits include analog switch circuitry.

Yet another aspect of the disclosure provides an apparatus configured for switching a signal. The apparatus including a first die lying within a first geometric plane; a first signal path on the first die; a first switch circuit on the first die coupled to the first signal path; a second die lying within a first geometric plane; a second signal path on the second die; a second switch circuit on the second die coupled to the second signal path; first means for controlling the first switch circuit to couple a signal from the first signal path to the second switch circuit; and second means for controlling the second switch circuit to couple the signal to a second signal path.

These and other aspects of the disclosure will become more fully understood upon a review of the detailed description, which follows. Other aspects, features, and implementations of the disclosure will become apparent to those of ordinary skill in the art, upon reviewing the following description of specific implementations of the disclosure in conjunction with the accompanying figures. While features of the disclosure may be discussed relative to certain implementations and figures below, all implementations of the disclosure can include one or more of the advantageous features discussed herein. In other words, while one or more implementations may be discussed as having certain advantageous features, one or more of such features may also be used in accordance with the various implementations of the disclosure discussed herein. In similar fashion, while certain implementations may be discussed below as device, system, or method implementations it should be understood that such implementations can be implemented in various devices, systems, and methods.

BRIEF DESCRIPTION OF THE DRAWINGS

FIG. 10, including the plan view of FIG. 10A and the side sectional view of FIG. 10B, is a schematic representation of an example of dynamically programmable switches in a 3D-IC in accordance with some aspects of the disclosure.

FIG. 12, including the plan view of FIG. 12A and the side sectional view of FIG. 12B, is a schematic representation of an example of switches located at a periphery of a 3D-IC in accordance with some aspects of the disclosure.

FIG. 13, including the plan view of FIG. 13A and the side sectional view of FIG. 13B, is a schematic representation of an example of power distribution in a 3D-IC in accordance with some aspects of the disclosure.

FIG. 14, including the plan view of FIG. 14A and the side sectional view of FIG. 14B, is a schematic representation of an example of power control circuits in a 3D-IC in accordance with some aspects of the disclosure.

FIG. 15, including the plan view of FIG. 15A and the side sectional view of FIG. 15B, is a schematic representation of an example of multi-level supply voltage circuits in a 3D-IC in accordance with some aspects of the disclosure.

FIG. 16, including the plan view of FIG. 16A and the side sectional view of FIG. 16B, is a schematic representation of an example of signal level shifter circuits in a 3D-IC in accordance with some aspects of the disclosure.

FIG. 17, including the plan view of FIG. 17A and the side sectional view of FIG. 17B, is a schematic representation of an example of memory circuits in a 3D-IC in accordance with some aspects of the disclosure.

FIG. 20, including the perspective view of FIG. 20A and the plan view of FIG. 20B, is an example of dies in different geometric planes in accordance with some aspects of the disclosure.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Figure 1:
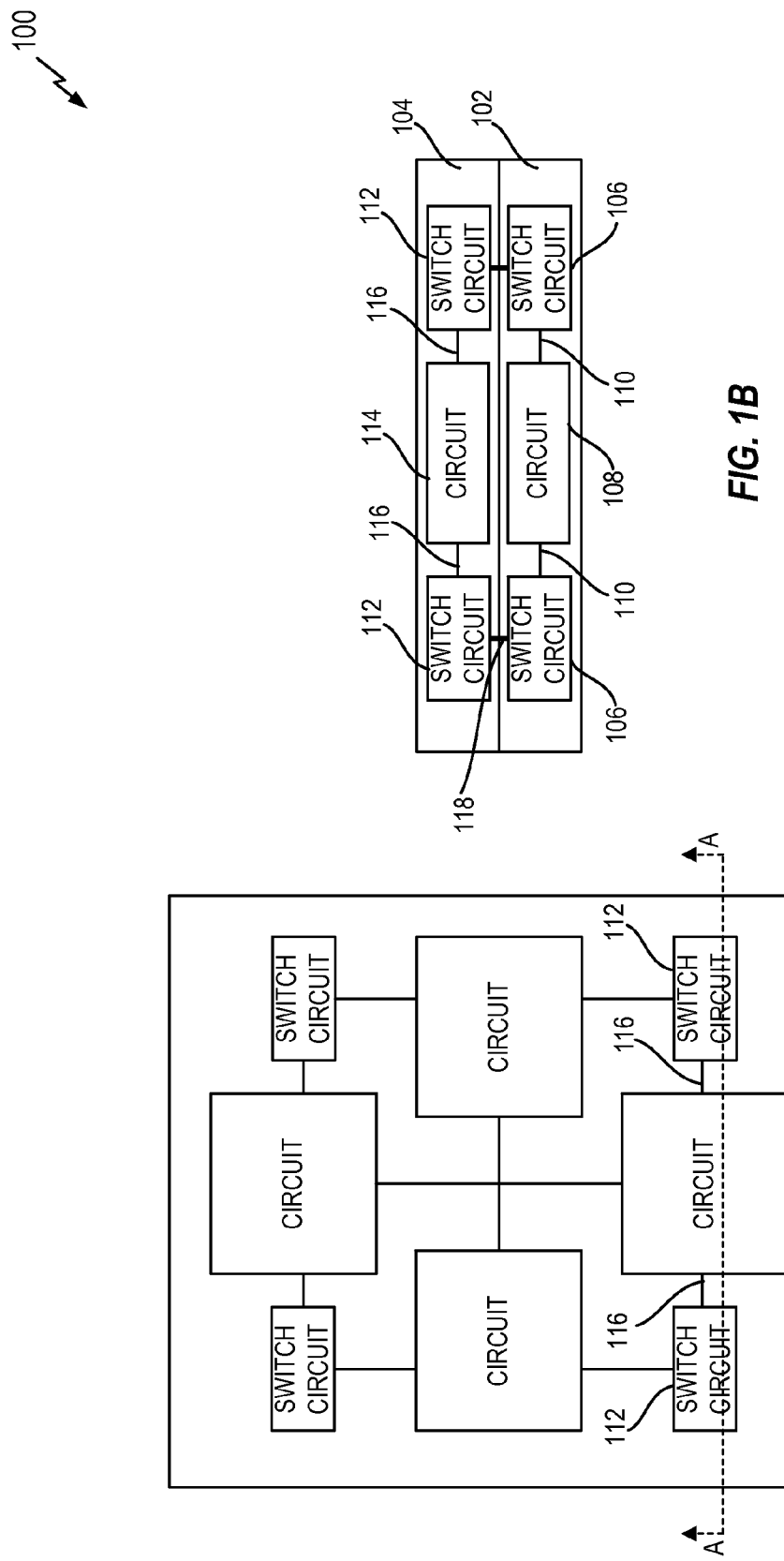
FIG. 1, including the plan view of FIG. 1A and the side sectional view of FIG. 1B, is a simplified example of a 3D-IC in accordance with some aspects of the disclosure.

FIG. 1 is a simplified example of a 3D-IC 100 in accordance with some aspects of the disclosure. FIG. 1 includes a plan view as shown in FIG. 1A, and a side sectional view as shown in FIG. 1B taken from the view A-A of FIG. 1A.

The 3D-IC 100 includes a first die 102 lying within a first geometric plane and a second die 104 lying within a second geometric plane. In this example, the first and second dies 102 and 104 are parallel to one another and in a stacked arrangement. Specifically, the second die 104 is stacked on top of the first die 102. Other die configurations may be employed in other implementations. For example, a 3D-IC implemented in accordance with the teachings herein may include more than two dies. In addition, in some implementations the dies are not stacked on top of the other. Also, in some implementations, the dies are not parallel (i.e., the dies lie in geometric planes that are not parallel with respect to one another).

Each of the dies includes electrically coupled switch circuits and other circuits (e.g., logic circuits, digital circuits, analog circuits, and so on). The first die 102 includes switch circuits 106 and circuits 108, where at least one of the switch circuits 106 is electrically coupled to at least one of the circuits 108 via at least one electrical path 110 (e.g., a signal bus). Similarly, the second die 104 includes switch circuits 112 and circuits 114, where at least one of the switch circuits 112 is electrically coupled to at least one of the circuits 114 via at least one electrical path 116 (e.g., a signal bus). Also, interconnections (e.g., an electrical path 118) are provided between the switch circuits 106 and 112.

In some implementations, each switch circuit supports one or more of: programmable signal routing, distribution of a voltage supply, distribution of multiple voltage supplies, or voltage level shifting. For convenience, such a switch circuit may be referred to herein as a peripheral switch (e.g., indicating that the switch may be separate from other circuit components of an IC).

A voltage control circuit (e.g., including a voltage regulator) can be integrated into a switch circuit to provide one or more voltages for an individual die. Thus, in some aspects, switch circuits on different dies may each be coupled to a power distribution path on the respective die. Moreover, in some aspects, switch circuits on different dies may each include a supply voltage control circuit. In implementations that employ multiple supply voltage levels, each of the supply voltage control circuits may generate a plurality of supply voltage levels. A level shifter can be included in a switch circuit to shift signal levels between different power supply domains. Thus, in some aspects, switch circuits on different dies may each be coupled to a power distribution path on the respective die.

For IC testing, a switch circuit can reroute test signals from one die to another. Thus, in some aspects, switch circuits on different dies may each be coupled to a test signal path on the respective die. By dynamically configuring the routing of test signals in this manner, design feasibility can be improved. Moreover, this dynamic switching functionality can be used to bypass a failed die by rerouting signals. The switch is thus valuable during the IC (chip) "bring-up" stage since it can be used to isolate the verification target and isolate the root cause of a failure.

Switch circuits as discussed herein may provide digital and/or analog connectivity. Digital switch circuitry may connect, for example and without limitation, one or more of: digital logic circuits, digital memory circuits, or digital power distribution circuits. Analog switch circuitry may connect, for example and without limitation, one or more of: analog logic circuits, analog power distribution circuits, analog radio frequency (RF) circuits (e.g., RF transmitter and/or RF receiver circuits), analog phase locked loop (PLL) circuits, or analog circuitry of digital-to-analog converter (DAC) circuits and/or analog-to-digital converter (DAC) circuits.

In view of the above, multiple dies with different functionality can be integrated into a single IC package. Advantageously, this can be achieved while mitigating conventional routing congestion and heat dissipation problems seen in conventional 3D architectures. As mentioned above, a conventional 3D-IC is implemented using either a 2.5D interposer architecture or fully stacked 3D architecture.

In a 2.5D interposer architecture, multiple dies are placed on top of an interposer and connected together through TSVs and a flip chip configuration. This approach reuses current system-on-chip (SoC) design methodology to shorten the design cycle as well as reduce the design cost. The interposer is manufactured with mature main stream technology to further offset the cost.

The concept of 2.5D ICs is based on a system-in-package (SiP) approach where different dices are placed on a common substrate. The interconnect between each die is built on the common substrate. Compared with SoC devices, SiP devices have the advantages of lower cost and higher flexibility because each die is implemented using that domain's most appropriate technology process.

Figure 2:
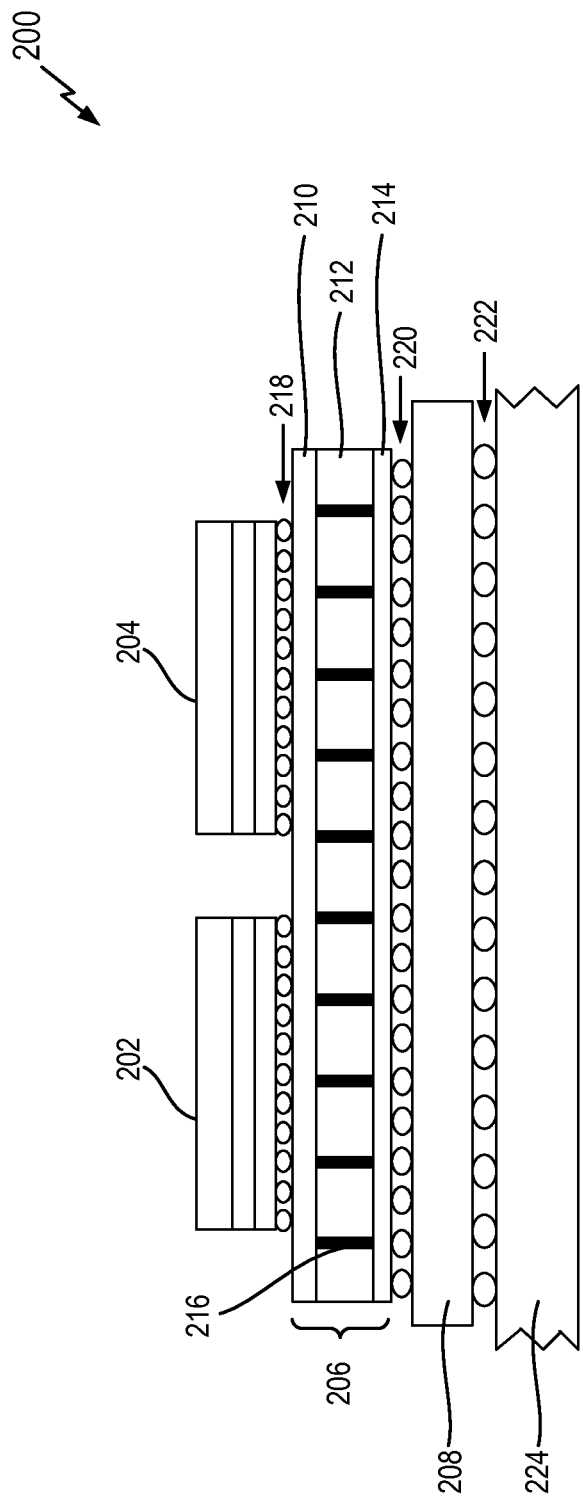
FIG. 2 is a side sectional view of a simplified example of a 2.5D IC.

FIG. 2 is a side sectional view of a simplified example of a conventional 2.5D IC 200. The 2.5D IC 200 includes a first die 202 and a second die 204.

As indicted, a silicon interposer 206 is placed between a SiP substrate 208 and the dice 202 and 204. The silicon interposer 206 includes topside metal layers 210, an interposer substrate 212, and backside metal layers 214. The silicon interposer 206 also includes through-silicon vias (TSVs) 216 connecting the metallization layers 210 and 214 on the upper and lower surfaces. Micro-bumps 218 attach the dice 202 and 204 and the interposer 206. The interposer 206 is attached to the SiP substrate 208 via flip-chip bumps 220. Package bumps 222 attach the SiP substrate 208 to a circuit board 224.

The tracks on the topside and backside metal layers of the interposer 206 are created using the same process as the track on the silicon chip, which resolves a major problem of two-dimensional (2D) ICs due to the size difference of tracks on substrate and those on dice. This discrepancy in 2D architectures results in performance loss and increased power consumption.

In a fully stacked 3D architecture, multiple dies are stacked together and connected through on-die TSVs. This can improve the overall system performance as well as reduce the cost. For example, fully stacked 3D-ICs are seen as a desirable alternative to overcome interconnect scaling issues that can be a major bottleneck on 2D ICs. Fully stacked 3D-ICs, with the advantage of a smaller footprint area, reduce the wire length on each layer. Also, TSV technology is implemented for vertical interconnect between dies, which reduces the long cross-chip interconnects that may exist in 2D ICs.

Figure 3:
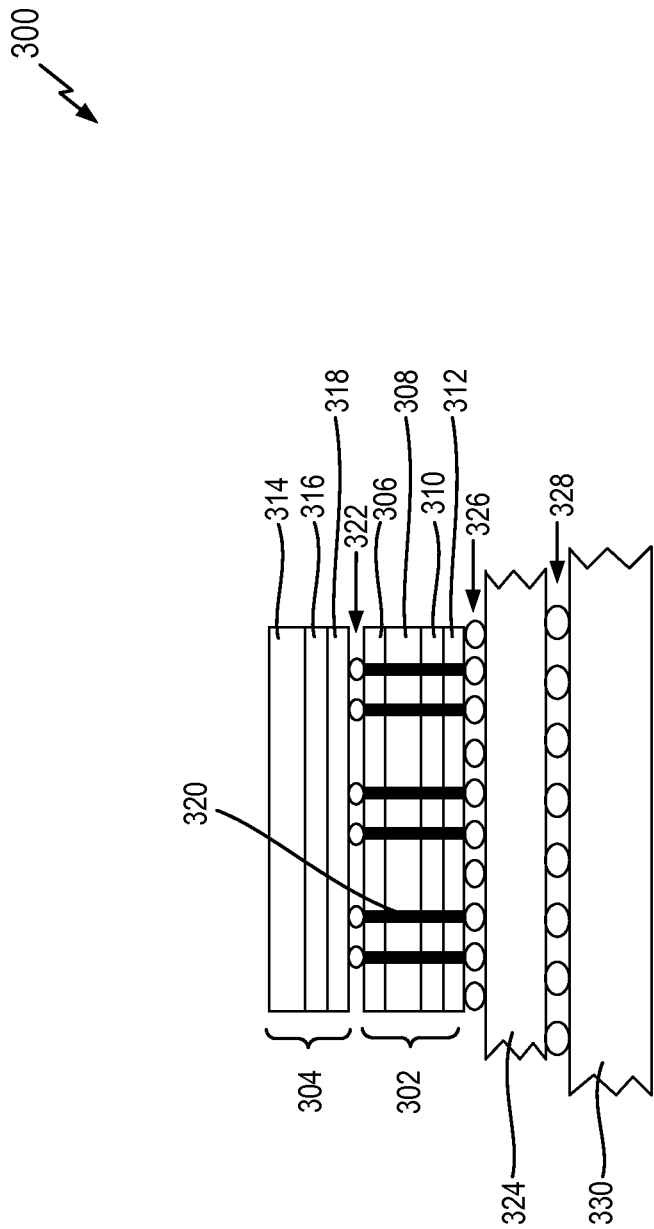
FIG. 3 is a side sectional view of a simplified example of a fully stacked 3D-IC.

FIG. 3 is a side sectional view of a simplified example of a conventional fully stacked 3D-IC 300. The 3D-IC 300 includes a first die 302 and a second die 304.

The first die 302 includes backside metal layers 306, a chip substrate 308, a device layer 310, and standard metal layers 312. The second die 304 includes a chip substrate 314, a device layer 316, and standard metal layers 318. The first die 302 includes TSVs 320 for connecting the metallization layers 306 and 312 on the upper and lower surfaces. Micro-bumps 322 attach the dice 302 and 304. The first die 302 is attached to a SiP substrate 324 via flip-chip bumps 326. Package bumps 328 attach the SiP substrate 324 to a circuit board 330.

Instead of using an interposer for routing and power distribution as in 2.5D ICs, the 3D-IC stacks dices directly and implements the routing in the intermediate dices. Since the thickness of an individual die is very small, ideally one could mount as many dices as needed. In practice, however, there are several challenges involved in manufacturing 3D-ICs, which restricts the application of 3D-ICs.

One challenge relates to the PDN design. The typical 3D-IC PDN is implemented as a pyramid shape where additional power rails supply power from the bottom die to the top die.

Figure 4:
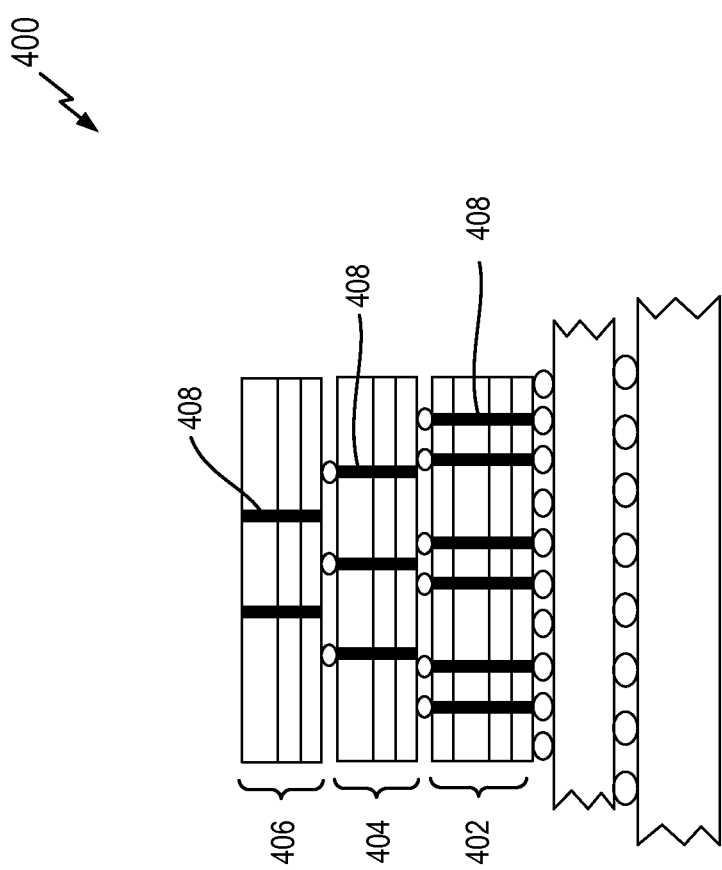
FIG. 4 is a side sectional view of a simplified power distribution network in a fully stacked 3D-IC.

FIG. 4 is a side sectional view of such a power distribution network in a conventional 3D-IC 400. The 3D-IC 400 includes a first die 402, a second die 404, and a third die 406. Each of the dice includes TSVs 408 for connecting, for example, respective metallization layers on upper and lower surfaces.

Here, it may be seen that the PDN TSVs 408 occupy significant die area and can create a routing congestion problem, particularly, on the lower dies. Moreover, in modern IC design, the current*resistance (IR) drop may be significant even if TSVs are used because the margin working voltage is smaller.

Besides the IR drop and space usage, PDNs have conventionally supplied only a restricted voltage scale because the PDNs use a single power supply from the circuit board. Therefore, the voltage only scales down as the supply passes from one layer to the next (e.g., due to IR drop). Moreover, a higher voltage in the lower layer leads to more severe thermal issues in that layer.

Another challenge in 3D-IC design relates to thermal management. When multiple dies are stacked together, it is difficult to dissipate the heat, especially for bottom dies. The overall system performance is dramatically degraded at high temperature. The use of micro-channels and liquid cooling has been proposed for 3D-IC designs; however, this technology has major drawbacks due to additional hardware requirements and operation difficulty. The use of additional TSVs can improve the heat dissipation, however, this may negatively impact the usable area on the die and the amount of stress the die can withstand.

Finally, testing methodology presents a challenge for 3D-IC design. It may be impractical or impossible to fully test the dies before packaging. Thus, traditional Known Good Die (KGD) procedures may be inapplicable. IEEE 1500 has been proposed to resolve this issue using an embedded testing approach; however, this approach is still under development.

Figure 5:
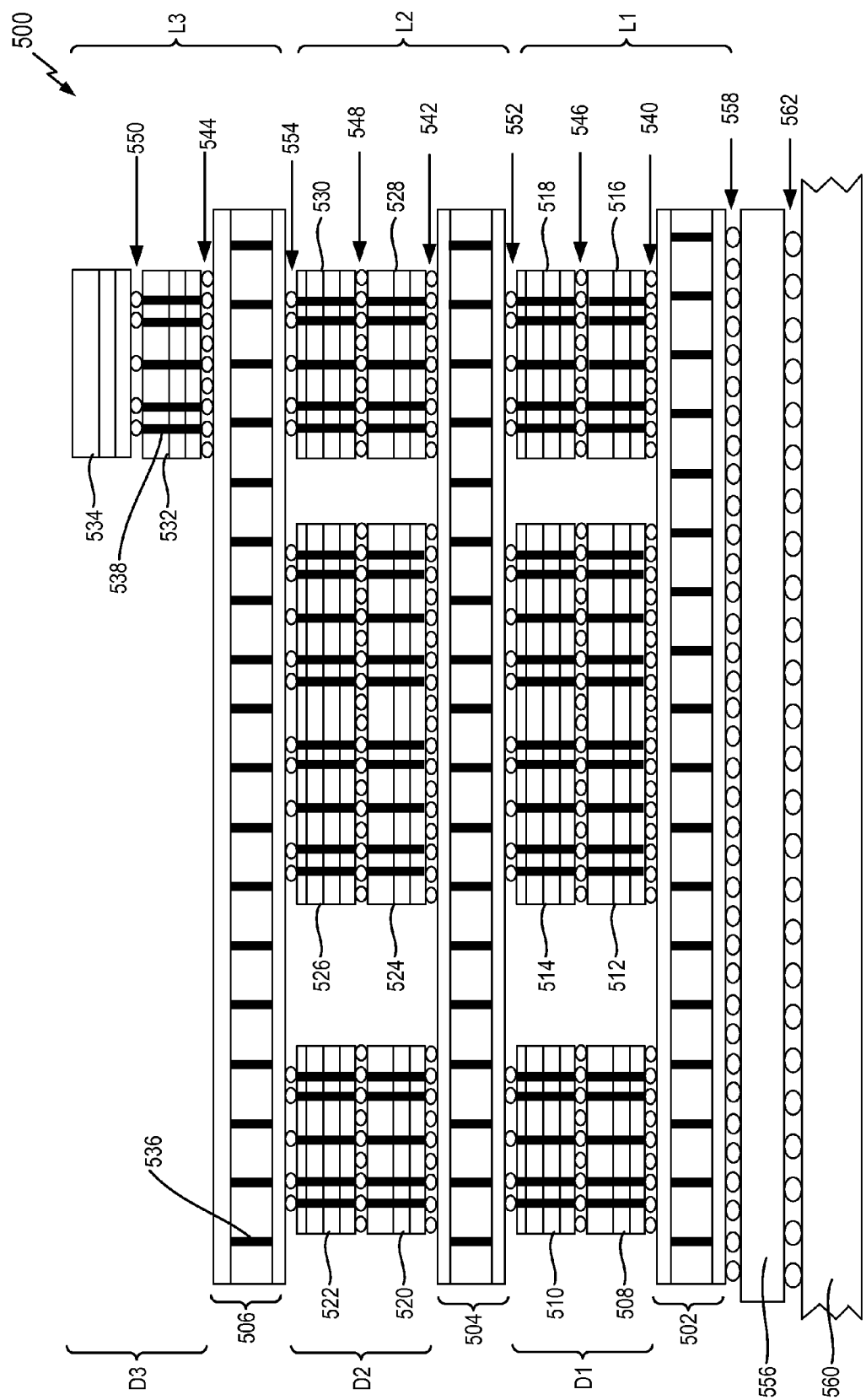
FIG. 5 is a side sectional view of a simplified example of a 3D-IC in accordance with some aspects of the disclosure.

Referring now to FIG. 5, the disclosure relates in some aspects to a 3D-IC hybrid architecture that includes programmable switch routing along with configuration advantages of the 2.5D and fully stacked 3D architectures. In some aspects, the architecture of FIG. 5 not only resolves PDN design and thermal management issues, but also provides additional power control and programmable routing capability for 3D-IC design.

In the side sectional view FIG. 5, a 3D-IC 500 includes a first layer L1, a second layer L2, and a third layer L3 in respective geometric planes (horizontal planes in the perspective of FIG. 5). Each of the first, second, and third layers L1, L2, and L3 includes a respective first, second, or third interposer layer 502, 504, or 506, and a respective first, second or third die layer D1, D2, or D3.

The first layer L1 lies within a first geometric plane. The first interposer layer 502 includes wire traces for electrically coupling the dice 508-518 of the first die layer D1. At least two of the stacked dice (e.g., a first pair of stacked dice 508 and 510 and/or a second pair of stacked dice 516 and 518) include at least one peripheral switch for wire routing in another dimension (a vertical dimension in the perspective of FIG. 5) to connect the first layer L1 to the other layers. At least one of the dice 508-518 (e.g., a third pair of stacked dice 512 and 514) includes at least one other circuit (e.g., at least one logic circuit, at least one digital circuit, at least one analog circuit, etc.).

The second layer L2 lies within a second geometric plane. The second interposer layer 504 includes wire traces for electrically coupling the dice 520-530 of the second die layer D2. At least two of the stacked dice (e.g., a first pair of stacked dice 520 and 522 and/or a second pair of stacked dice 528 and 530) include at least one peripheral switch for wire routing in another dimension (a vertical dimension in the perspective of FIG. 5) to connect the second layer L2 to the other layers. At least one of the dice 520-530 (e.g., a third pair of stacked dice 524 and 526) includes at least one other circuit (e.g., at least one logic circuit, at least one digital circuit, at least one analog circuit, etc.).

The third layer L3 lies within a third geometric plane. The third interposer layer 506 includes wire traces for electrically coupling the dice 532 and 534 of the third die layer D3. A portion of the stacked dice 532 and 534 includes at least one peripheral switch for wire routing in another dimension (a vertical dimension in the perspective of FIG. 5) to connect the third layer L3 to the other layers. Another portion of the stacked dice 532 and 534 includes at least one other circuit (e.g., at least one logic circuit, at least one digital circuit, at least one analog circuit, etc.).

Each of the first, second and third layers L1, L2, and L3 includes TSVs as represented by the thick vertical lines. For example, a TSV 536 is specifically referenced in the third interposer layer 506 and a TSV 538 is specifically referenced in the third die layer D3.

FIG. 5 also illustrates the bonding and interconnections within and between the first, second and third layers L1, L2, and L3 and other components of the 3D-IC 500. Bumps (e.g., solder balls) 540 attach the dice of the first layer L1 to the first interposer layer 502. Bumps 542 attach the dice of the second layer L2 to the second interposer layer 504. Bumps 544 attach the dice of the third layer L3 to the third interposer layer 506. Bumps 546 attach the stacked dice of the first layer L1. Bumps 548 attach the stacked dice of the second layer L2. Bumps 550 attach the stacked dice of the third layer L3. Bumps 552 attach the dice of the first layer L1 to the second interposer layer 504. Bumps 554 attach the dice of the second layer L2 to the third interposer layer 506. Bumps 558 attach the first interposer layer 502 to a SiP substrate 556. Bumps 562 attach the SiP substrate 556 to a circuit board 560.

The peripheral switches (e.g., crossbar switches, field programmable switches, or other dynamically switchable switches) can be used to reroute signals between layers by dynamically coupling at least one signal path on one layer (e.g., a signal bus, a test signal path, a power distribution path, etc.) to at least one signal path on at least one other layer. Thus, the 3D-IC 500 can be reprogrammable for different applications.

In this architecture, a PDN can be routed from the bottom substrate through vertical peripheral switches and horizontal interposers to supply power to upper dies. Thus, this architecture may significantly reduce the PDN area in the bottom active dies and mitigate routing congestion problems. Moreover, for multi-core architectures (e.g., quad core processors, etc.) each fabricated layer (e.g., die) in a 3D-IC can be identical (the peripheral switches may subsequently be programmed to provide the desired routing). Thus, in contrast to the architecture of FIG. 4, a 3D-IC constructed in accordance with the teachings herein may be easier to design and manufacture.

Other types of signals (i.e., not just PDN signals) can be routed through peripheral switches in accordance with the teachings herein. For example, critical signals could be routed to different dies through the interposer and peripheral switch.

A voltage control circuit and regulator can be integrated into a peripheral switch to supply different voltages to the individual die. Moreover, a peripheral switch can include an additional level shifter and a storage unit to transfer the signals among different power domains and even store the data before shut down of the individual die.

Advantageously, a peripheral switch can be implemented using a low cost, main stream process with large feature geometry. Consequently, the disclosed architecture is highly suitable for voltage regulator implementations and reduced product cost. Moreover, a peripheral switch can be implemented in different 3D-ICs to improve the overall flexibility.

From a testing perspective, the disclosed architecture not only increases design feasibility, it can facilitate bypassing a failed die and rerouting the signals to preserve the overall integrity of the IC. This functionality is valuable in the chip bring-up stage since it can be used to isolate the verification target and identify the root cause of a failure.

In view of the above, peripheral switching as taught herein supports a multiple voltage supply mechanism as well as programmable routing for heterogeneous integration. In some aspects, peripheral switching as taught herein can provide predefined dynamic power control and a routing switch center. Moreover, several dies with different functionality can integrated into single package without some of the routing congestion and heat dissipation problems seen in conventional architectures.

Figure 6:
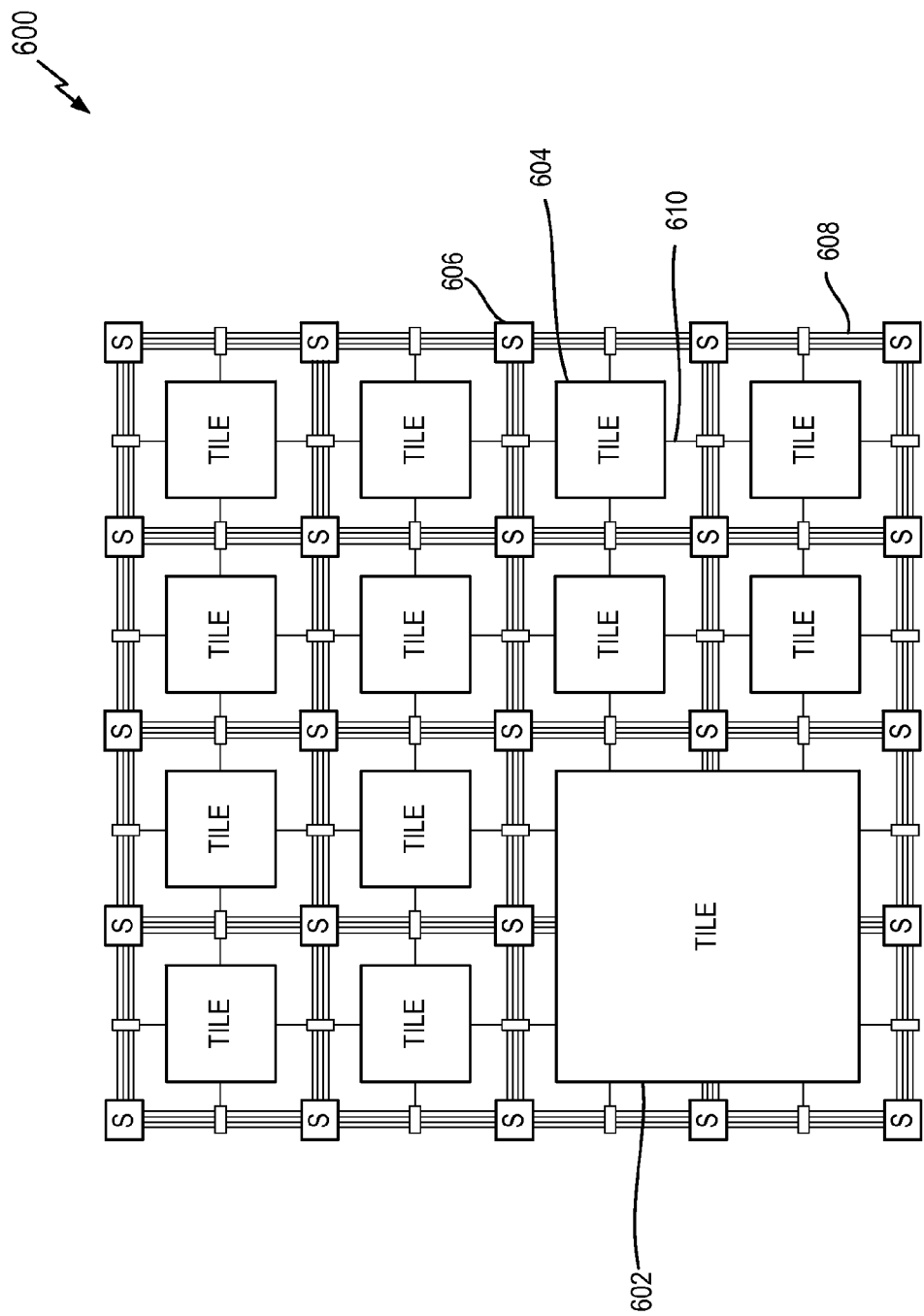
FIG. 6 is a plan view of a simplified example of a 3D-IC in accordance with some aspects of the disclosure.
Figure 7:
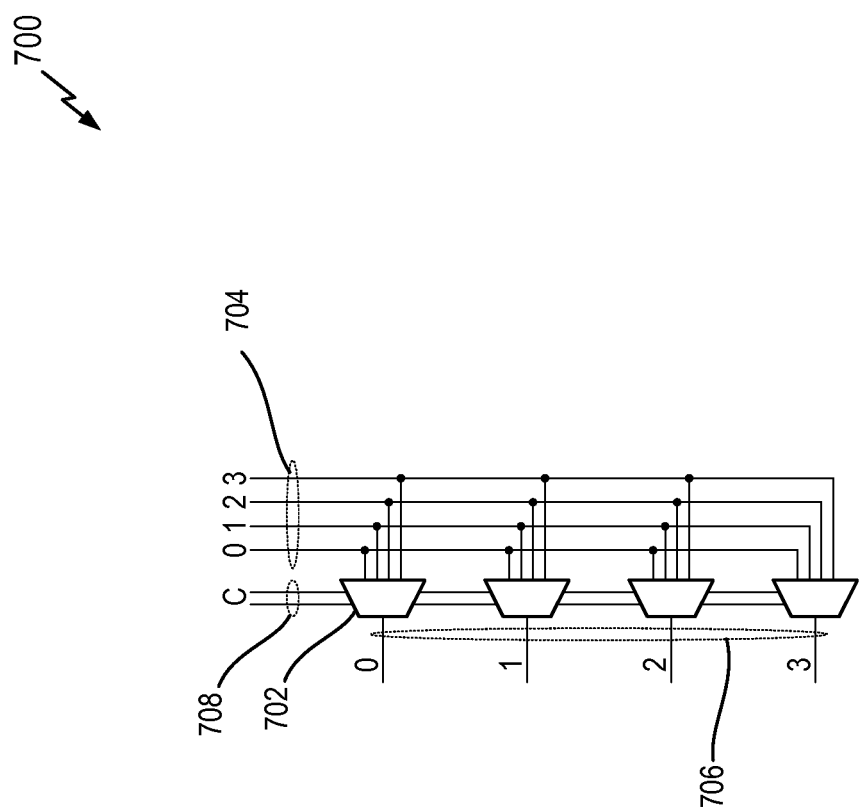
FIG. 7 is a schematic representation of an example of a switch in accordance with some aspects of the disclosure.
Figure 8:
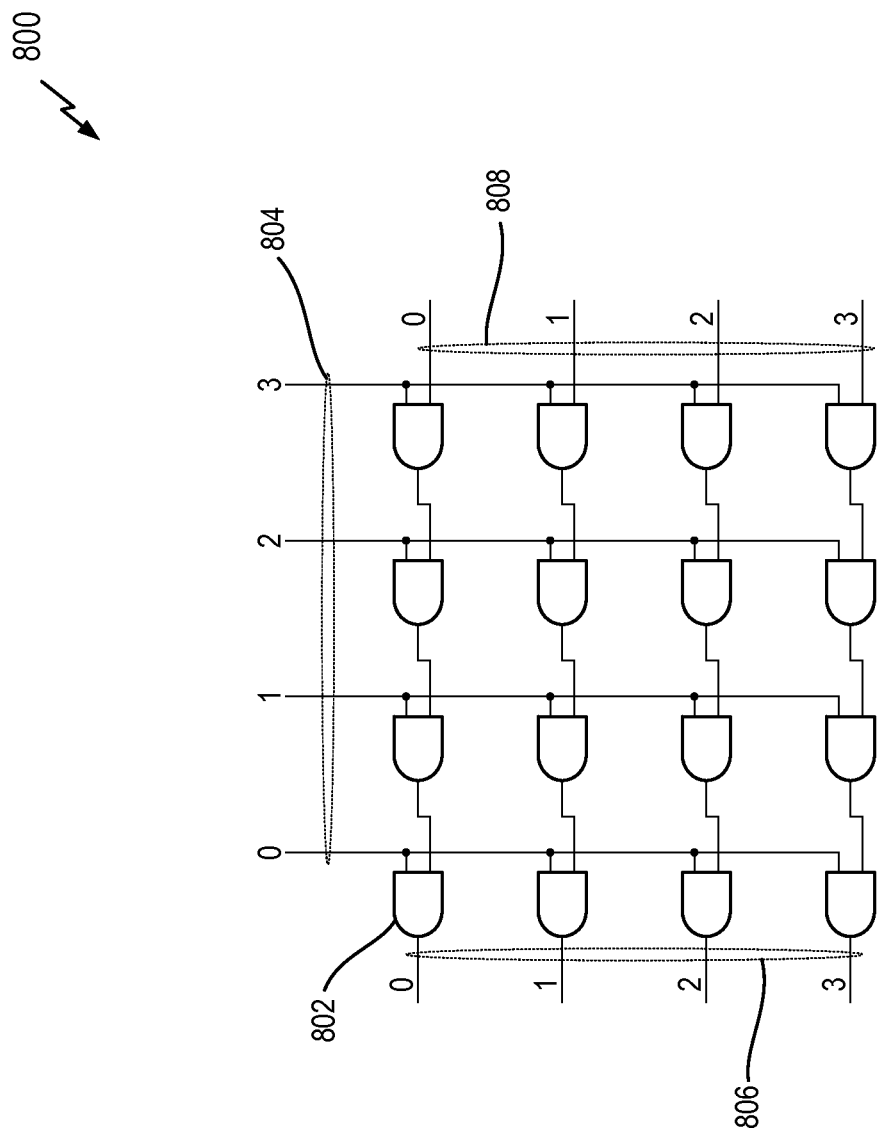
FIG. 8 is a schematic representation of another example of a switch in accordance with some aspects of the disclosure.

FIG. 6 is a plan view of a simplified example of a 3D-IC 600 in accordance with some aspects of the disclosure. Logic circuits or other types of circuits are represented by the larger tiles (e.g., the largest tile 602 and a medium-sized tile 604). Peripheral switches (S) are represented by the smaller tiles (e.g., the peripheral switch 606). Routing tracks (e.g., a routing track 608) between peripheral switches and/or other circuits are also indicated, as well as input/output (I/O) connections (e.g., an I/O connection 610) between circuits and routing tracks. In some aspects, a peripheral switch may couple any of the routing tracks from one side (e.g., top, bottom, left or right) of the switch to any other routing track or I/O connection on another side of the switch. FIGS. 7 and 8 illustrate two examples of the peripheral switch 606.

FIG. 7 illustrates an example of a routing switch 700 (e.g., the peripheral switch 606) that includes a series of 4:1 multiplexers (e.g., a multiplexer 702). Each multiplexer couples one of four inputs 704 to a corresponding output 706 according to control signals 708. Thus, in operation, a logic circuit on the die or some other circuit generates the control signals 708 to dynamically control which tracks (e.g., one or more of the routing tracks of FIG. 6) the routing switch 700 will couple together at a given point in time. It should be appreciated that a routing switch may take other forms in other implementations.

FIG. 8 illustrates an example of a power switch 800 (e.g., the peripheral switch 606) that includes a series of two input control gates (e.g., a control gate 802). In some implementations, the control gates are AND gates. The control gates couple power from a given input 804 to a given output 806 according to control signals 808. Thus, in operation, a logic circuit on the die or some other circuit generates the control signals 808 to dynamically control which tracks (e.g., one or more of the routing tracks of FIG. 6) the power switch 800 will couple together at a given point in time. It should be appreciated that a power switch may take other forms in other implementations.

Figure 9:
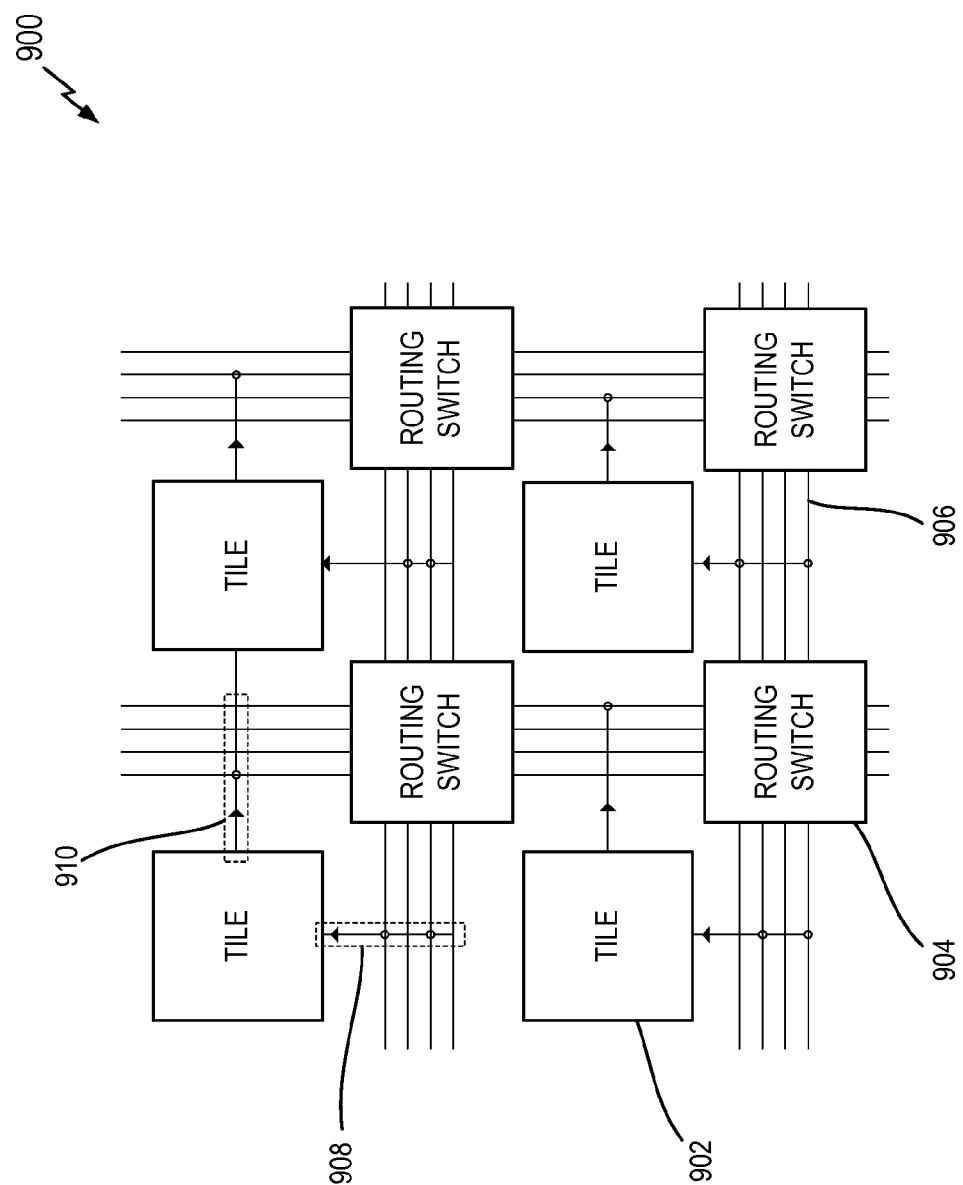
FIG. 9 is a plan view of a simplified example of routing between circuits and switches in accordance with some aspects of the disclosure.

FIG. 9 is a plan view of a simplified example of peripheral switches in a 3D-IC 900 in accordance with some aspects of the disclosure. Logic blocks or other types of circuits are represented by the tiles (e.g., a tile 902). Peripheral switches are represented by programmable routing switches (e.g., a routing switch 904) disposed between the tiles. This figure also shows signal paths (e.g., a routing track 906) that connect to the logic blocks (or other circuits) and the peripheral switches. FIG. 9 also illustrates I/O connections for the tiles including input connections (e.g., an input connection 908) and output connections (e.g., an output connection 910).

Referring now to FIG. 10, in some aspects, each of the peripheral switches (switch circuits) may be dynamically switchable. For example, a switch circuit may take the form of a crossbar switch and/or a field programmable switch. In some aspects, a switch circuit may selectively couple signals to another circuit (e.g., at least one logic circuit, at least one digital circuit, at least one analog circuit, etc.). In some aspects, a switch circuit may selectively couple signals to another layer (e.g., to a switch circuit on another die).

FIG. 10 is a schematic representation of an example of dynamically programmable switches in a 3D-IC 1000 in accordance with some aspects of the disclosure. FIG. 10 includes a plan view as shown in FIG. 10A, and a side sectional view as shown in FIG. 10B taken from the view A-A of FIG. 10A. The 3D-IC includes a first layer (e.g., die) 1002 and a second layer (e.g., die) 1004 stacked on top of the first layer 1002.

Dynamically programmable switches (DPSs) are distributed throughout each layer in the horizontal direction (from this view). For example, the second layer 1004 includes DPSs 1006 and 1008, while the first layer 1002 includes DPSs 1012 and 1014. This facilitates connectivity with other components on the respective layer.

As indicated in FIG. 10B, dynamically programmable switches (e.g., switches 1006 and 1012 and switches 1008 and 1014) are stacked in the vertical direction (from this view). This facilitates connectivity between layers, thus enabling signals to be dynamically switched across layers. As represented by the signal paths (e.g., the signal paths 1016 and 1018) between circuits (e.g., the circuits 1020 and 1022) and the dynamically programmable switches (e.g., the switches 1006 and 1012), one or more of the circuits of the 3D-IC 1000 may control the dynamically programmable switches. As represented by the signal paths (e.g., the signal path 1024) between the dynamically programmable switches (e.g., the switches 1008 and 1014), one or more of the dynamically programmable switches may control another dynamically programmable switch or route corresponding control signals thereto.

Figure 11:
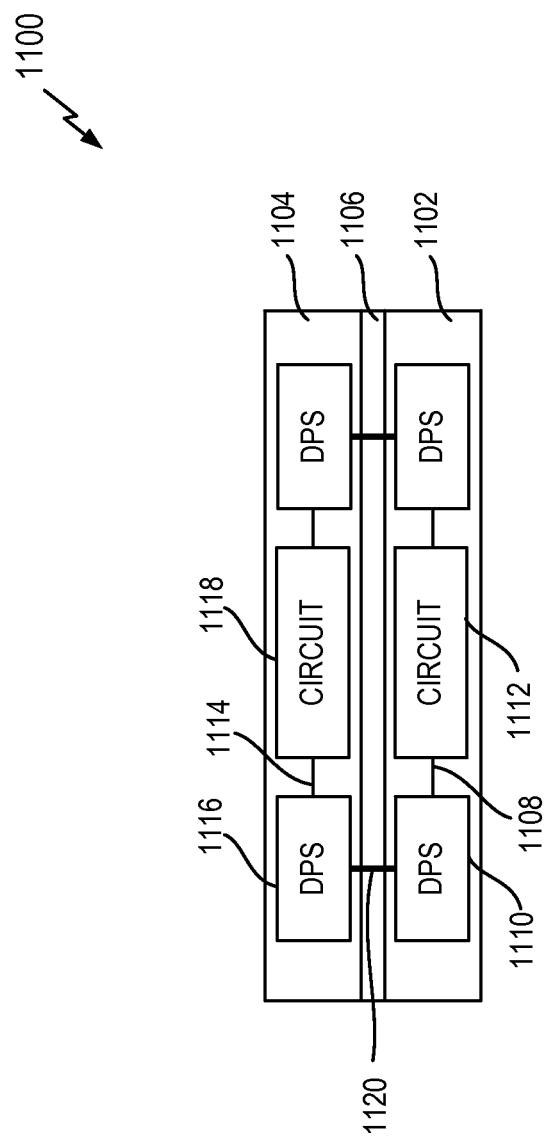
FIG. 11 is a side sectional schematic representation of signal path routing in a 3D-IC in accordance with some aspects of the disclosure.

Through the use of such dynamically programmable switches, signal paths on different layers can be dynamically coupled and decoupled. An example of these signal paths is depicted in FIG. 11 where a first die layer 1102 and a second die layer 1104 are coupled to an interposer (interposer layer) 1106. Here, a first signal path 1108 of the first die layer 1102 is electrically coupled to a first switch circuit (DPS) 1110. For example, the first signal path 1108 may be a signal bus, a test signal path, a power distribution path, or some other signal path that is electrically coupled to a first circuit 1112 (e.g., at least one logic circuit, at least one digital circuit, at least one analog circuit, etc.). A second signal path 1114 of the second die layer 1104 is electrically coupled to a second switch circuit 1116. For example, the second signal path 1114 may be electrically coupled to a second circuit 1118 (e.g., at least one logic circuit, at least one digital circuit, at least one analog circuit, etc.). A third signal path 1120 is routed from the first die layer 1102 to the second die layer 1104 through the interposer 1106, thereby electrically coupling the first switch circuit 1110 and the second switch circuit 1116. Thus, the first signal path 1108 may be dynamically coupled to and uncoupled from the second signal path 1114.

Referring to FIG. 12, in some aspects, each of the switch circuits may be located at a periphery of a die. In this way, heat dissipation on the die may be improved and routing congestion on the die may be mitigated as compared to conventional architectures. For example, by locating the switch circuits in this manner, improved heat transfer may be achieved from the center to the edge of the IC package (e.g., through an RDL and TSVs). Moreover, this scheme is much simpler than micro-channel solutions for thermal management.

FIG. 12 is a schematic representation of an example of switches located at a periphery of a 3D-IC 1200 in accordance with some aspects of the disclosure. FIG. 12 includes a plan view as shown in FIG. 12A, and a side sectional view as shown in FIG. 12B taken from the view A-A of FIG. 12A.

The 3D-IC 1200 includes a first layer (e.g., die) 1202 and a second layer (e.g., die) 1204. As indicated, a first switch circuit 1206 is located at a first periphery 1210 of the first layer 1202, and a second switch circuit 1208 is located at a second periphery 1212 of the second layer 1204.

In some aspects, switch circuits may be used in a power distribution network of a 3D-IC to distribute power to other circuits (e.g., at least one logic circuit, at least one digital circuit, at least one analog circuit, etc.). FIG. 13 is a schematic representation of an example of power distribution in a 3D-IC 1300 in accordance with some aspects of the disclosure. FIG. 13 includes a plan view as shown in FIG. 13A, and a side sectional view as shown in FIG. 13B taken from the view A-A of FIG. 13A.

The 3D-IC 1300 includes a first layer (e.g., die) 1302 and a second layer (e.g., die) 1304. As indicated, a first power distribution path 1306 (e.g., for providing power to a first circuit 1308) of the second layer 1304 is electrically coupled to a first switch circuit 1310. Similarly, a second power distribution path 1312 (e.g., for providing power to a second circuit 1314) of the first layer 1302 is electrically coupled to a second switch circuit 1316. In addition, a third power distribution path 1318 electrically couples the first switch circuit 1310 and the second switch circuit 1316. Thus, power may be dynamically switched between layers as needed.

In some aspects, one or more of the switch circuits may each include a power control circuit for supplying power to a corresponding layer (e.g., die layer). FIG. 14 is a schematic representation of an example of power control circuits in a 3D-IC 1400 in accordance with some aspects of the disclosure. FIG. 14 includes a plan view as shown in FIG. 14A, and a side sectional view as shown in FIG. 14B taken from the view A-A of FIG. 14A.

The 3D-IC 1400 includes a first layer (e.g., die) 1402 and a second layer (e.g., die) 1404. As indicated, a first switch circuit 1406 on the first layer 1402 includes a first supply voltage control circuit (SVCC) 1410, and a second switch circuit 1408 on the second layer 1404 includes a second supply voltage control circuit 1412. Thus, the first SVCC 1410 may control power supplied to a first circuit 1414 (e.g., at least one logic circuit, at least one digital circuit, at least one analog circuit, etc.) via a first supply path 1416 on the first layer 1402. In addition, the second SVCC 1412 may control power supplied to a second circuit 1418 (e.g., at least one logic circuit, at least one digital circuit, at least one analog circuit, etc.) via a second supply path 1420 on the second layer 1404. Accordingly, independent power control can be provided on a layer-by-layer basis through the use of peripheral switches as taught herein. Moreover, in some aspects, the first SVCC 1410 and the second SVCC 1412 may cooperate via signaling 1422 to provide power to the different layers.

Referring to FIG. 15, in some aspects, more than one power supply voltage level may be used on a given die. For example, one or more of the supply voltage control circuits of FIG. 14 may each generate a plurality of supply voltage levels used by different voltage domains on a respective die.

FIG. 15 is a schematic representation of an example of multi-level supply voltage circuits in a 3D-IC 1500 in accordance with some aspects of the disclosure. FIG. 15 includes a plan view as shown in FIG. 15A, and a side sectional view as shown in FIG. 15B taken from the view A-A of FIG. 15A.

The 3D-IC 1500 includes a first layer (e.g., die) 1502 and a second layer (e.g., die) 1504. As indicated, a first switch circuit 1506 on the first layer 1502 includes a first voltage supply circuit 1510 coupled to a first supply path 1512 of the first layer 1502 and a second voltage supply circuit 1514 coupled to a second supply path 1516 of the first layer 1502. Similarly, a second switch circuit 1508 on the second layer 1504 includes a first voltage supply circuit 1518 coupled to a first supply path 1520 of the second layer 1504 and a second voltage supply circuit 1522 coupled to a second supply path 1524 of the second layer 1504. Thus, different power levels can be independently provided on a layer-by-layer basis through the use of peripheral switches as taught herein. For example, different dies manufactured using different processes may employ different power levels (e.g., 3.5 V versus 1.8 V). Accordingly, a single power supply voltage (e.g., a main supply signal 1526) could be supplied to the peripheral switches whereby the voltage supply circuit(s) on each peripheral switch provides the appropriate voltage level(s) for the die(s) on the corresponding level.

Referring to FIG. 16, in some aspects, one or more of the switch circuits may each include a voltage shifter circuit that is used to shift the level of a signal on a respective die. For example, the level of a signal may need to be shifted to accommodate different voltage domains (e.g., on different dies) that use different supply voltage levels.

FIG. 16 is a schematic representation of an example of signal level shifter circuits in a 3D-IC 1600 in accordance with some aspects of the disclosure. FIG. 16 includes a plan view as shown in FIG. 16A, and a side sectional view as shown in FIG. 16B taken from the view A-A of FIG. 16A.

The 3D-IC 1600 includes a first layer (e.g., die) 1602 and a second layer (e.g., die) 1604. As indicated, a first switch circuit 1606 on the first layer 1602 includes a first voltage level shifter (VLS) 1610 coupled to a first signal path 1612 and a second signal path 1614 of the first layer 1602. Thus, the first VLS 1610 may shift the signaling level of a signal received on the first signal path 1612 (e.g., from one die) to a different signaling level and output the resulting signal on the second signal path 1614 (e.g., to a different die). Similarly, a second switch circuit 1608 on the second layer 1604 includes a second VLS 1616 coupled to a third signal path 1618 and a fourth signal path 1620 of the second layer 1604. Accordingly, the second VLS 1616 may shift the signaling level of a signal received on the third signal path 1618 to a different signaling level and output the resulting signal on the fourth signal path 1620.

Referring to FIG. 17, a memory device (e.g., a register file) can be included in a peripheral switch to store data. For example, data from a die may be stored in such a memory device prior to shutting down the individual die (e.g., due to a fault condition). FIG. 17 is a schematic representation of an example of memory circuits in a 3D-IC 1700 in accordance with some aspects of the disclosure. FIG. 17 includes a plan view as shown in FIG. 17A, and a side sectional view as shown in FIG. 17B taken from the view A-A of FIG. 17A.

The 3D-IC 1700 includes a first layer (e.g., die) 1702 and a second layer (e.g., die) 1704. As indicated, a first switch circuit 1706 on the first layer 1702 includes a first memory device (MD) 1710 that is coupled to a first signal path 1712 of the first layer 1702. Similarly, a second switch circuit 1708 on the second layer 1704 includes a second memory device 1714 that is coupled to a second signal path 1716 of the second layer 1704. Accordingly, data from a first circuit 1718 (e.g., at least one logic circuit, at least one digital circuit, at least one analog circuit, etc.) on the first layer 1702 and/or a second circuit 1720 (e.g., at least one logic circuit, at least one digital circuit, at least one analog circuit, etc.) on the second layer 1704 may be stored in the first MD 1710 and/or the second MD 1714.

Figure 18:
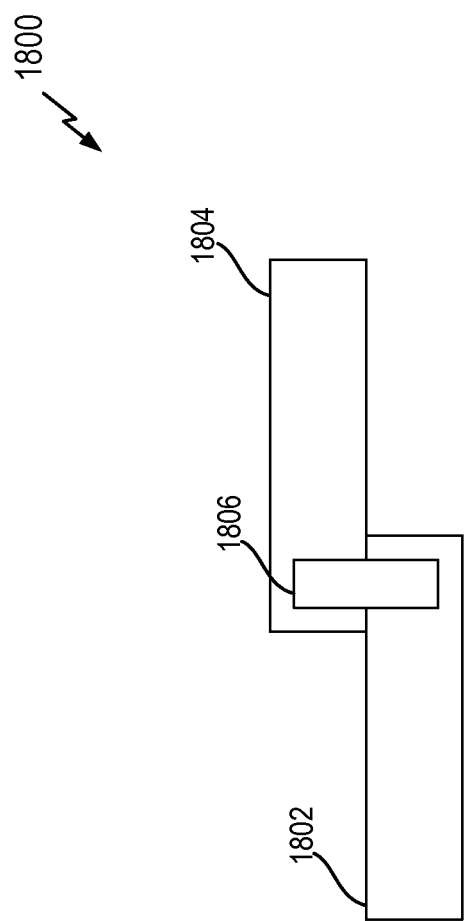
FIG. 18 is a side view of a simplified example of offset dies in accordance with some aspects of the disclosure.
Figure 19:
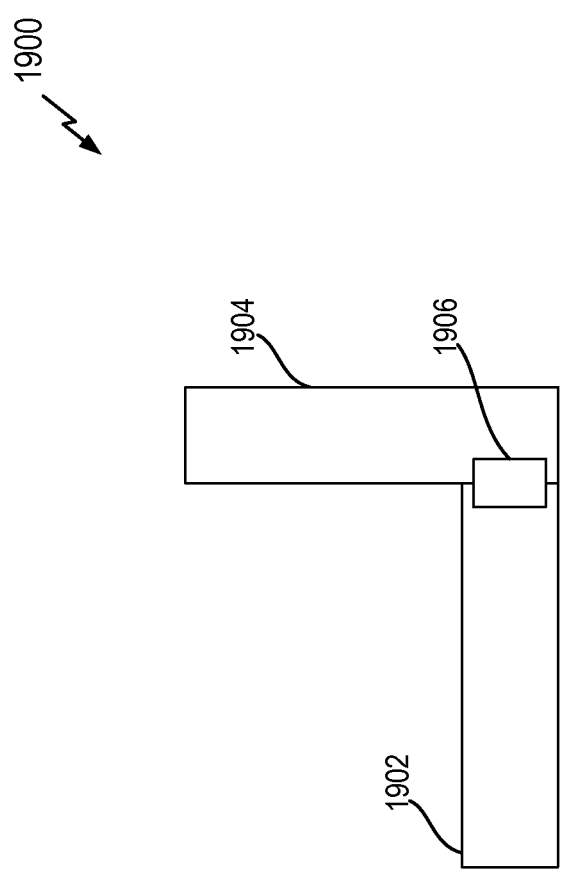
FIG. 19 is a side view of a simplified example of dies in different geometric planes in accordance with some aspects of the disclosure.

As mentioned above, dies may be oriented with respect to each other in different ways in different implementations. FIGS. 18-20 illustrate three non-limiting examples of potential orientations.

FIG. 18 is a side view of a simplified example of offset dies 1800 in accordance with some aspects of the disclosure. Here, a first die 1802 is offset (horizontally in this view) from a second die 1804. In accordance with the teachings herein, at least one peripheral switch 1806 is included in and/or coupled to each of the first and second dies 1802 and 1804.

FIG. 19 is a side view of a simplified example of dies in different geometric planes 1900 in accordance with some aspects of the disclosure. In this case, a first die 1902 is at a right angle to a second die 1904. In accordance with the teachings herein, at least one peripheral switch 1906 is included in and/or coupled to each of the first and second dies 1902 and 1904.

FIG. 20 is a simplified example of dies in different geometric planes 2000 in accordance with some aspects of the disclosure. FIG. 20 includes a perspective view as shown in FIG. 20A, and a plan view as shown in FIG. 20B. In this example, a first die 2002, a second die 2004, and a third die 2006 are all at right angles with respect to one another. In accordance with the teachings herein, at least one peripheral switch 2008 is included in and/or coupled to each of the first die 2002, the second die 2004, and the third die 2006.

It should be appreciated that dies need not be disposed at right angles as shown in FIGS. 19 and 20. Rather, it may be advantageous to route dies at other angles in some implementations.

Example Electronic Device

Figure 21:
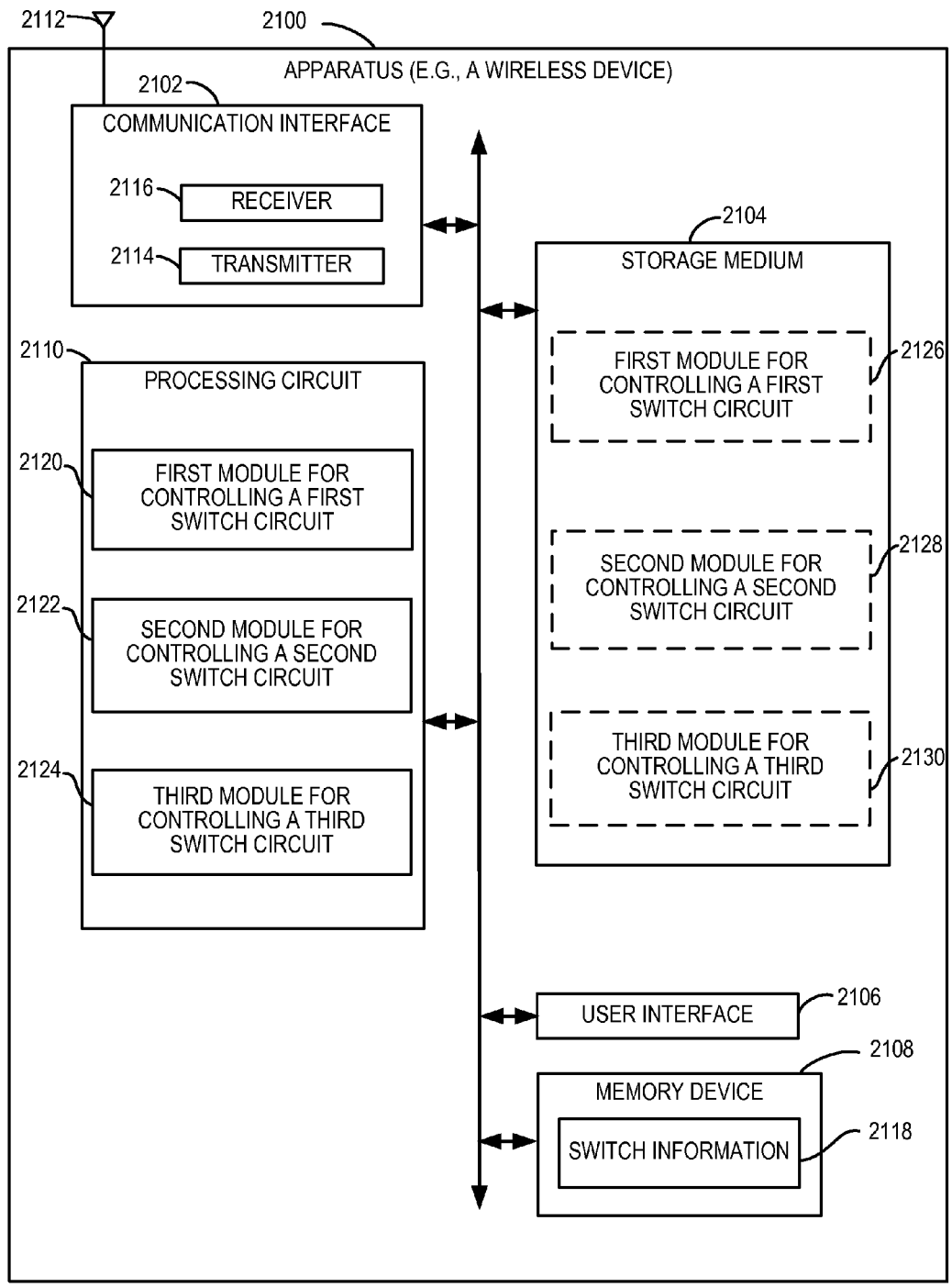
FIG. 21 is a block diagram of an example hardware implementation for an electronic device that supports switching in accordance with some aspects of the disclosure.

FIG. 21 is an illustration of an apparatus 2100 that may be implemented as a 3D-IC according to one or more aspects of the disclosure. The apparatus 2100 includes a communication interface (e.g., at least one transceiver) 2102, a storage medium 2104, a user interface 2106, a memory device 2108, and a processing circuit 2110.

These components can be coupled to and/or placed in electrical communication with one another via a signaling bus or other suitable component, represented generally by the connection lines in FIG. 21. The signaling bus may include any number of interconnecting buses and bridges depending on the specific application of the processing circuit 2110 and the overall design constraints. The signaling bus links together various circuits such that each of the communication interface 2102, the storage medium 2104, the user interface 2106, and the memory device 2108 are coupled to and/or in electrical communication with the processing circuit 2110. The signaling bus may also link various other circuits (not shown) such as timing sources, peripherals, voltage regulators, and power management circuits, which are well known in the art, and therefore, will not be described any further.

The communication interface 2102 may be adapted to facilitate wireless communication of the apparatus 2100. For example, the communication interface 2102 may include circuitry and/or programming adapted to facilitate the communication of information bi-directionally with respect to one or more communication devices in a network. The communication interface 2102 may be coupled to one or more antennas 2112 for wireless communication within a wireless communication system. The communication interface 2102 can be configured with one or more standalone receivers and/or transmitters, as well as one or more transceivers. In the illustrated example, the communication interface 2102 includes a transmitter 2114 and a receiver 2116.

The memory device 2108 may represent one or more memory devices. As indicated, the memory device 2108 may maintain switch information 2118 along with other information used by the apparatus 2100. In some implementations, the memory device 2108 and the storage medium 2104 are implemented as a common memory component. The memory device 2108 may also be used for storing data that is manipulated by the processing circuit 2110 or some other component of the apparatus 2100.

The storage medium 2104 may represent one or more computer-readable, machine-readable, and/or processor-readable devices for storing programming, such as processor executable code or instructions (e.g., software, firmware), electronic data, databases, or other digital information. The storage medium 2104 may also be used for storing data that is manipulated by the processing circuit 2110 when executing programming. The storage medium 2104 may be any available media that can be accessed by a general purpose or special purpose processor, including portable or fixed storage devices, optical storage devices, and various other mediums capable of storing, containing or carrying programming.

By way of example and not limitation, the storage medium 2104 may include a magnetic storage device (e.g., hard disk, floppy disk, magnetic strip), an optical disk (e.g., a compact disc (CD) or a digital versatile disc (DVD)), a smart card, a flash memory device (e.g., a card, a stick, or a key drive), a random access memory (RAM), a read only memory (ROM), a programmable ROM (PROM), an erasable PROM (EPROM), an electrically erasable PROM (EEPROM), a register, a removable disk, and any other suitable medium for storing software and/or instructions that may be accessed and read by a computer. The storage medium 2104 may be embodied in an article of manufacture (e.g., a computer program product). By way of example, a computer program product may include a computer-readable medium in packaging materials. In view of the above, in some implementations, the storage medium 2104 may be a non-transitory (e.g., tangible) storage medium.

The storage medium 2104 may be coupled to the processing circuit 2110 such that the processing circuit 2110 can read information from, and write information to, the storage medium 2104. That is, the storage medium 2104 can be coupled to the processing circuit 2110 so that the storage medium 2104 is at least accessible by the processing circuit 2110, including examples where at least one storage medium is integral to the processing circuit 2110 and/or examples where at least one storage medium is separate from the processing circuit 2110 (e.g., resident in the apparatus 2100, external to the apparatus 2100, distributed across multiple entities, etc.).

Programming stored by the storage medium 2104, when executed by the processing circuit 2110, causes the processing circuit 2110 to perform one or more of the various functions and/or process operations described herein. For example, the storage medium 2104 may include operations configured for regulating operations at one or more hardware blocks of the processing circuit 2110, as well as to utilize the communication interface 2102 for wireless communication utilizing their respective communication protocols.

The processing circuit 2110 is generally adapted for processing, including the execution of such programming stored on the storage medium 2104. As used herein, the term "programming" shall be construed broadly to include without limitation instructions, instruction sets, data, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise.

The processing circuit 2110 is arranged to obtain, process and/or send data, control data access and storage, issue commands, and control other desired operations. The processing circuit 2110 may include circuitry configured to implement desired programming provided by appropriate media in at least one example. For example, the processing circuit 2110 may be implemented as one or more processors, one or more controllers, and/or other structure configured to execute executable programming. Examples of the processing circuit 2110 may include a general purpose processor, a digital signal processor (DSP), an application specific integrated circuit (ASIC), a field programmable gate array (FPGA) or other programmable logic component, discrete gate or transistor logic, discrete hardware components, or any combination thereof designed to perform the functions described herein. A general purpose processor may include a microprocessor, as well as any conventional processor, controller, microcontroller, or state machine. The processing circuit 2110 may also be implemented as a combination of computing components, such as a combination of a DSP and a microprocessor, a number of microprocessors, one or more microprocessors in conjunction with a DSP core, an ASIC and a microprocessor, or any other number of varying configurations. These examples of the processing circuit 2110 are for illustration and other suitable configurations within the scope of the disclosure are also contemplated.

According to one or more aspects of the disclosure, the processing circuit 2110 may be adapted to perform any or all of the features, processes, functions, operations and/or routines for any or all of the apparatuses described herein. As used herein, the term "adapted" in relation to the processing circuit 2110 may refer to the processing circuit 2110 being one or more of configured, employed, implemented, and/or programmed to perform a particular process, function, operation and/or routine according to various features described herein.

According to at least one example of the apparatus 2100, the processing circuit 2110 may include one or more of a first module for controlling a first switch circuit 2120, a second module for controlling a second switch circuit 2122, and a third module for controlling a third switch circuit 2124.

The first module for controlling a first switch circuit 2120 may include circuitry and/or programming (e.g., a first module for controlling a first switch circuit 2126 stored on the storage medium 2104) adapted to perform several functions relating to, for example controlling a switch circuit to couple electrical paths on one die to electrical paths on another die. In some aspects, this coupling is achieved via another switch circuit on the other die. Initially, the first module for controlling a first switch circuit 2120 obtains received information (e.g., from the memory device 2108, the receiver 2116, or some other component). For example, the first module for controlling a first switch circuit 2120 may receive an indication that affects how the switch circuit is to be controlled. In some implementations, the first module for controlling a first switch circuit 2120 identifies a memory location in the memory device 2108 that stores the indication and invokes a read of that location. In some implementations, the first module for controlling a first switch circuit 2120 processes the received indication to determine how to control the switch circuit. The first module for controlling a first switch circuit 2120 then generates, based on the received information, a control signal that controls the switch circuit.

The second module for controlling a second switch circuit 2122 may include circuitry and/or programming (e.g., a second module for controlling a second switch circuit 2128 stored on the storage medium 2104) adapted to perform several functions relating to, for example controlling a switch circuit to couple electrical paths on one die to electrical paths on another die. In some aspects, this coupling is achieved via another switch circuit on the other die. Initially, the second module for controlling a second switch circuit 2122 obtains received information (e.g., from the memory device 2108, the receiver 2116, or some other component). For example, the second module for controlling a second switch circuit 2122 may receive an indication that affects how the switch circuit is to be controlled. In some implementations, the second module for controlling a second switch circuit 2122 identifies a memory location in the memory device 2108 that stores the indication and invokes a read of that location. In some implementations, the second module for controlling a second switch circuit 2122 processes the received indication to determine how to control the switch circuit. The second module for controlling a second switch circuit 2122 then generates, based on the received information, a control signal that controls the switch circuit.

The third module for controlling a third switch circuit 2124 may include circuitry and/or programming (e.g., a third module for controlling a third switch circuit 2130 stored on the storage medium 2104) adapted to perform several functions relating to, for example controlling a switch circuit to couple electrical paths on one die to electrical paths on another die. In some aspects, this coupling is achieved via another switch circuit on the other die. Initially, the third module for controlling a third switch circuit 2124 obtains received information (e.g., from the memory device 2108, the receiver 2116, or some other component). For example, the third module for controlling a third switch circuit 2124 may receive an indication that affects how the switch circuit is to be controlled. In some implementations, the third module for controlling a third switch circuit 2124 identifies a memory location in the memory device 2108 that stores the indication and invokes a read of that location. In some implementations, the third module for controlling a third switch circuit 2124 processes the received indication to determine how to control the switch circuit. The third module for controlling a third switch circuit 2124 then generates, based on the received information, a control signal that controls the switch circuit.

As mentioned above, programming stored by the storage medium 2104, when executed by the processing circuit 2110, causes the processing circuit 2110 to perform one or more of the various functions and/or process operations described herein. For example, the storage medium 2104 may include one or more of the first module for controlling a first switch circuit 2126, the second module for controlling a second switch circuit 2128, or the third module for controlling a third switch circuit 2130.

Example Processes

Figure 22:
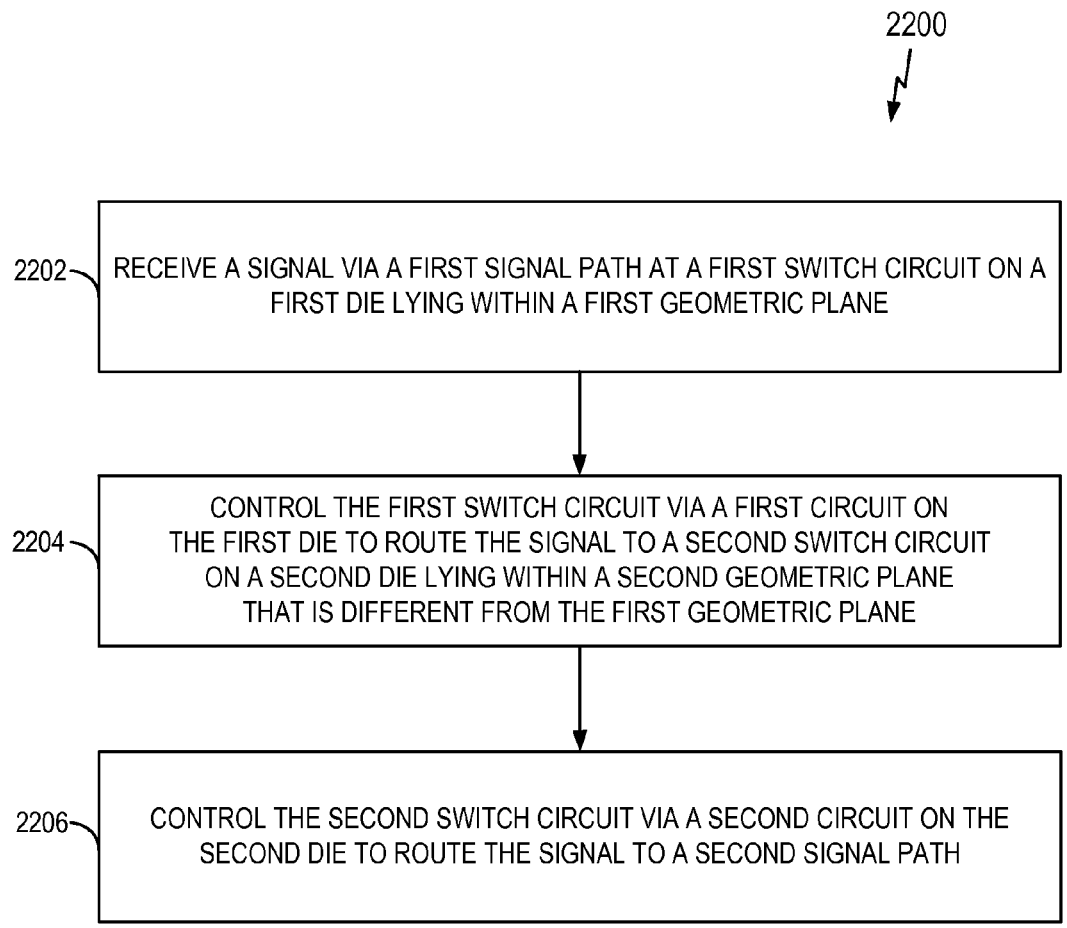
FIG. 22 illustrates an example of a switching process in accordance with some aspects of the disclosure.

FIG. 22 illustrates a switching process 2200 in accordance with some aspects of the disclosure. The process 2200 may take place within a 3D-IC (e.g., one or more of the 3D-IC of any of FIG. 1, 5, 6, or 9-21), at least partially within a processing circuit (e.g., the processing circuit 2110 of FIG. 21), which may be located in an electronic device, a transceiver, or some other suitable apparatus. Of course, in various aspects within the scope of the disclosure, the process 2200 may be implemented by any suitable apparatus capable of supporting switching operations.

At block 2202, a signal is received via a first signal path at a first switch circuit. The first switch circuit is on a first die that lies within a first geometric plane.

The signal may take different forms in different implementations. In some aspects, the signal may be a test signal (e.g., that is selectively routed between first and second dies). In some aspects, the signal may be a power supply voltage signal (e.g., a +3.5 V supply voltage, a −3.5 V supply voltage, etc.).

At block 2204, the first switch circuit is controlled via a first circuit to route the signal to a second switch circuit. The first circuit is on the first die. The second switch circuit is on a second die that lies within a second geometric plane. The second geometric plane is different from the first geometric plane.

At block 2206, the second switch circuit is controlled via a second circuit to route the signal to a second signal path. The second circuit is on the second die.

In some aspects, the first and second circuits include logic circuits. In some aspects, the first and second switch circuits include analog switch circuitry.

The first and second die may be oriented relative to one another in various ways. In some cases, the second die is stacked on top of the first die. In some cases, the first and second geometric planes are parallel, while in other cases they might not be.

In some implementations, the signal is routed to at least one other die. For example, the process 2200 also may include controlling the second switch circuit via the second logic circuit to route the signal to a third switch circuit, where the third circuit is on a third die lying within a third geometric plane that is different from the first and second geometric planes. The process 2200 may then include controlling the third switch circuit via a third logic circuit to route the signal to a third signal path, where the third logic circuit is on the third die.

Figure 23:
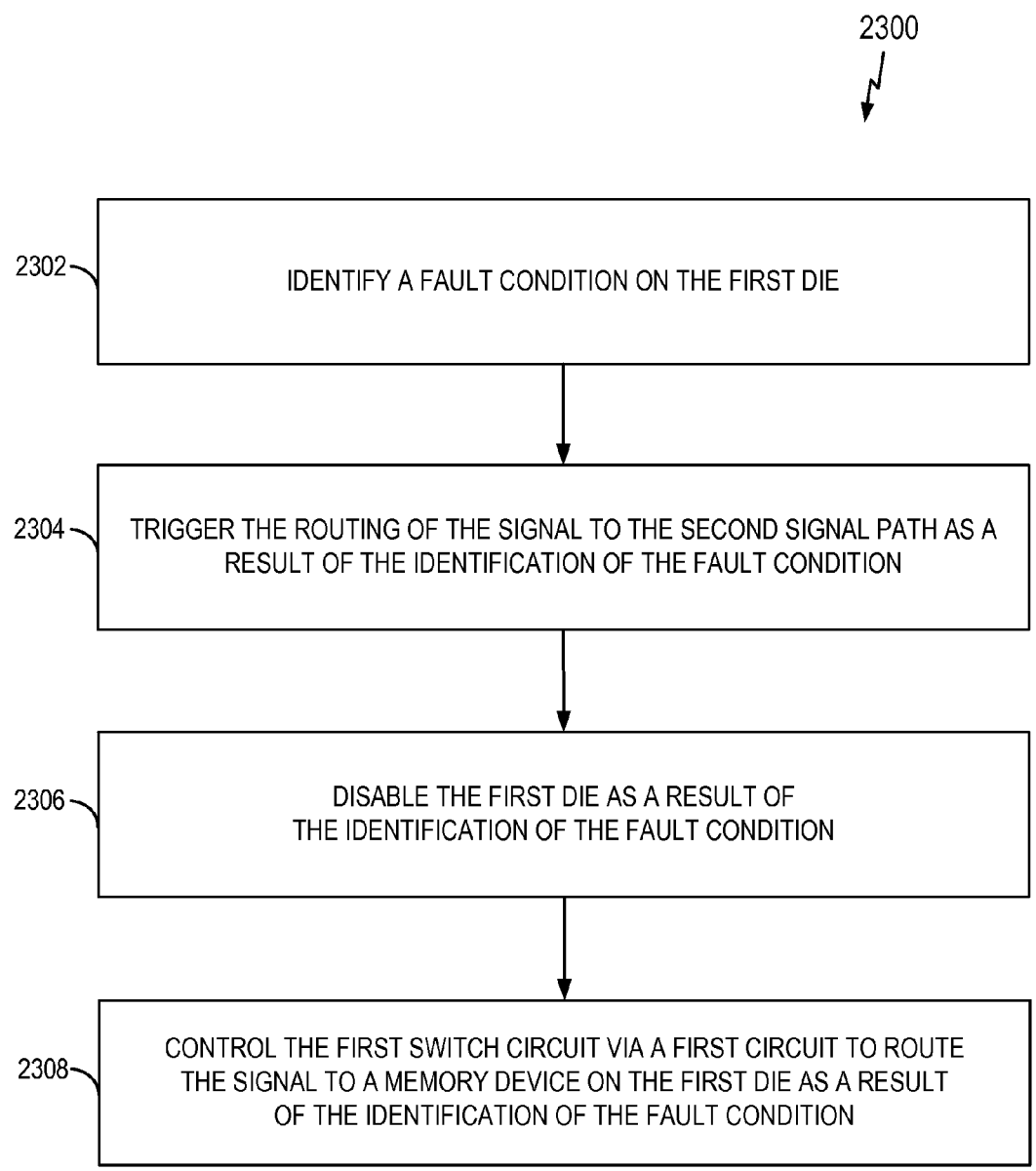
FIG. 23 illustrates an example of a process for addressing a fault condition in accordance with some aspects of the disclosure.

FIG. 23 illustrates a process 2300 for handling a fault condition in accordance with some aspects of the disclosure. The process 2300 may take place within a 3D-IC (e.g., one or more of the 3D-IC of any of FIG. 1, 5, 6, or 9-21), at least partially within a processing circuit (e.g., the processing circuit 2110 of FIG. 21), which may be located in an electronic device, a transceiver, or some other suitable apparatus. Of course, in various aspects within the scope of the disclosure, the process 2300 may be implemented by any suitable apparatus capable of supporting fault operations.

At block 2302, a fault condition is identified on the first die. For example, a diagnostic test performed on a component of the first die may have returned a failure indication.

At block 2304, routing of the signal to the second signal path (e.g., at block 2206 above) may be triggered as a result of the identification of the fault condition at block 2302.

At block 2306, in some implementations, the first die is disabled as a result of the identification of the fault condition at block 2303.

At block 2308, as a result of the identification of the fault condition at block 2302, the first switch circuit may be controlled via a first circuit (e.g., a logic circuit) to route the signal to a memory device on the second die. In this way, information previously stored or existing on the first die may be saved on in a memory device before the first die is disabled.

CONCLUSION

One or more of the components, steps, features and/or functions illustrated in the figures may be rearranged and/or combined into a single component, step, feature or function or embodied in several components, steps, or functions. Additional elements, components, steps, and/or functions may also be added without departing from novel features disclosed herein. The apparatus, devices, and/or components illustrated in the figures may be configured to perform one or more of the methods, features, or steps described herein. The novel algorithms described herein may also be efficiently implemented in software and/or embedded in hardware.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

Additional elements, components, steps, and/or functions may also be added or not utilized without departing from the disclosure.

While features of the disclosure may have been discussed relative to certain implementations and figures, all implementations of the disclosure can include one or more of the advantageous features discussed herein. In other words, while one or more implementations may have been discussed as having certain advantageous features, one or more of such features may also be used in accordance with any of the various implementations discussed herein. In similar fashion, while exemplary implementations may have been discussed herein as device, system, or method implementations, it should be understood that such exemplary implementations can be implemented in various devices, systems, and methods.

Also, it is noted that at least some implementations have been described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. In some aspects, a process may correspond to a method, a function, a procedure, a subroutine, a subprogram, etc. When a process corresponds to a function, its termination corresponds to a return of the function to the calling function or the main function. One or more of the various methods described herein may be partially or fully implemented by programming (e.g., instructions and/or data) that may be stored in a machine-readable, computer-readable, and/or processor-readable storage medium, and executed by one or more processors, machines and/or devices.

Those of skill in the art would further appreciate that the various illustrative logical blocks, modules, circuits, and algorithm steps described in connection with the implementations disclosed herein may be implemented as hardware, software, firmware, middleware, microcode, or any combination thereof. To clearly illustrate this interchangeability, various illustrative components, blocks, modules, circuits, and steps have been described above generally in terms of their functionality. Whether such functionality is implemented as hardware or software depends upon the particular application and design constraints imposed on the overall system.

Within the disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another-even if they do not directly physically touch each other. For instance, a first die may be coupled to a second die in a package even though the first die is never directly physically in contact with the second die. The terms "circuit" and "circuitry" are used broadly, and intended to include both hardware implementations of electrical devices and conductors that, when connected and configured, enable the performance of the functions described in the disclosure, without limitation as to the type of electronic circuits, as well as software implementations of information and instructions that, when executed by a processor, enable the performance of the functions described in the disclosure.

As used herein, the term "determining" encompasses a wide variety of actions. For example, "determining" may include calculating, computing, processing, deriving, investigating, looking up (e.g., looking up in a table, a database or another data structure), ascertaining, and the like. Also, "determining" may include receiving (e.g., receiving information), accessing (e.g., accessing data in a memory), and the like. Also, "determining" may include resolving, selecting, choosing, establishing, and the like.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

Accordingly, the various features associated with the examples described herein and shown in the accompanying drawings can be implemented in different examples and implementations without departing from the scope of the disclosure. Therefore, although certain specific constructions and arrangements have been described and shown in the accompanying drawings, such implementations are merely illustrative and not restrictive of the scope of the disclosure, since various other additions and modifications to, and deletions from, the described implementations will be apparent to one of ordinary skill in the art. Thus, the scope of the disclosure is only determined by the literal language, and legal equivalents, of the claims which follow.

What is claimed is:

1. An integrated circuit, comprising:
a first die lying within a first geometric plane and comprising a first circuit, electrically coupled to a first switch circuit via a first signal path, wherein the first switch circuit comprises a first voltage supply circuit for providing a first power supply voltage to the first signal path; and
a second die lying within a second geometric plane that is different from the first geometric plane, the second die comprising a second circuit, electrically coupled to a second switch circuit via a second signal path, wherein the second switch circuit comprises a second voltage supply circuit for providing, independently from the first voltage supply circuit, a second power supply voltage to the second signal path,
wherein the first switch circuit is electrically coupled to the second switch circuit via a third signal path,
and wherein the first switch circuit is configured to control the second switch circuit and dynamically control the first and second power supply voltage via the first signal path, the second signal path, and the third signal path.

2. The integrated circuit of claim 1, wherein the second die is stacked on top of the first die.

3. The integrated circuit of claim 1, wherein each of the first and second switch circuits comprises a dynamically switchable switch.

4. The integrated circuit of claim 1, wherein:
the first switch circuit comprises a first supply voltage control circuit; and
the second switch circuit comprises a second supply voltage control circuit.

5. The integrated circuit of claim 4, wherein each of the first and second supply voltage control circuits generates a plurality of supply voltage levels.

6. The integrated circuit of claim 1, wherein:
the first switch circuit comprises a first voltage level shifter coupled to the first signal path of the first die; and
the second switch circuit comprises a second voltage level shifter coupled to the second signal path of the second die.

7. The integrated circuit of claim 1, wherein:
the first switch circuit comprises a first memory device coupled to the first signal path of the first die; and
the second switch circuit comprises a second memory device coupled to the second signal path of the second die.

8. The integrated circuit of claim 1, wherein:
the first switch circuit is located at a first periphery of the first die; and
the second switch circuit is located at a second periphery of the second die.

9. The integrated circuit of claim 1, further comprising:
a third die lying within a third geometric plane that is different from the first and second geometric planes, the third die comprising a third circuit and a third switch circuit, the third switch circuit electrically coupled to the third circuit through a fourth signal path and to the first and second switch circuits through a fifth signal path.

10. The integrated circuit of claim 1, wherein the first and second circuits comprise logic circuits.

11. The integrated circuit of claim 1, wherein the first and second switch circuits comprise analog switch circuitry.

12. An integrated circuit, comprising:
a first interposer layer lying within a first geometric plane;
a first die layer stacked on the first interposer layer and comprising a first die and a second die, the first die comprising a first circuit, the second die comprising a first switch circuit, the first switch circuit comprises a first voltage supply circuit for providing a first power supply voltage to a first signal path electrically coupled to the first circuit;
a second interposer layer lying within a second geometric plane that is different from the first geometric plane; and
a second die layer stacked on the second interposer layer and comprising a third die and a fourth die, the third die comprising a second circuit, the fourth die comprising a second switch circuit, the second switch circuit comprises a second voltage supply circuit for providing, independently from the first voltage supply circuit, a second power supply voltage to a second signal path electrically coupled to the second circuit, wherein the first switch circuit of the first die layer is electrically coupled to the second switch circuit of the second die layer via a third signal path routed from the first die layer through the second interposer layer to the second die layer, and wherein the first switch circuit is configured to control the second switch circuit and dynamically control the first and second power supply voltage.

13. The integrated circuit of claim 12, wherein each of the first and second switch circuits comprises a dynamically switchable switch.

14. The integrated circuit of claim 12, wherein the second interposer layer is stacked on top of the first die layer.

15. The integrated circuit of claim 12, wherein:
the first switch circuit comprises a first supply voltage control circuit configured to supply at least one first supply voltage to the first circuit; and
the second switch circuit comprises a second supply voltage control circuit configured to supply at least one second supply voltage to the second circuit.

16. The integrated circuit of claim 15, wherein each of the at least one first supply voltage and the at least one second supply voltage comprises a plurality of supply voltage levels.

17. The integrated circuit of claim 12, wherein:
the second die is located at a first periphery of the first die layer; and
the fourth die is located at a second periphery of the second die layer.

18. The integrated circuit of claim 12, further comprising:
a third interposer layer lying within a third geometric plane that is different from the first and second geometric planes; and
a third die layer stacked on the third interposer layer and comprising a fifth die and a sixth die, the fifth die comprising a third circuit, the sixth die comprising a third switch circuit, the third switch circuit electrically coupled to the third circuit and the first and second switch circuits.

19. The integrated circuit of claim 12, wherein the first and second circuits comprise logic circuits.

20. The integrated circuit of claim 12, wherein the first and second switch circuits comprise analog switch circuitry.

21. A method for switching a signal, comprising:
receiving a signal via a first signal path at a first switch circuit of a first die lying within a first geometric plane, wherein the signal comprises a first power supply voltage signal from a first voltage supply circuit of the first switch circuit;
controlling the first switch circuit via a first circuit to control a second switch circuit of a second die lying within a second geometric plane that is different from the first geometric plane, wherein the second switch circuit comprises a second voltage supply circuit for providing, independently from the first voltage supply circuit, a second power supply voltage to a second signal path;
controlling the first switch circuit via the first circuit to dynamically route the signal to the second switch circuit; and controlling the second switch circuit via a second circuit to dynamically route at least one of the signal and/or the second power supply voltage to the second signal path.

22. The method of claim 21, wherein the second die is stacked on top of the first die.

23. The method of claim 21, further comprising:
identifying a fault condition of the first die; and
triggering the routing of the signal to the second signal path as a result of the identification of the fault condition.

24. The method of claim 23, further comprising:
controlling the first switch circuit via the first circuit to route the signal to a memory device of the second die as a result of the identification of the fault condition.

25. The method of claim 23, further comprising:
disabling the first die as a result of the identification of the fault condition.

26. The method of claim 21, further comprising:
controlling the second switch circuit via the second circuit to route the signal to a third switch circuit of a third die lying within a third geometric plane that is different from the first and second geometric planes; and
controlling the third switch circuit via a third circuit to route the signal to a third signal path.

27. The method of claim 21, wherein the first and second circuits comprise logic circuits.

28. The method of claim 21, wherein the first and second switch circuits comprise analog switch circuitry.

29. An apparatus for switching a signal, comprising:
a first die lying within a first geometric plane, the first die comprising a first switch circuit coupled to a first signal path, wherein the first switch circuit comprises a first voltage supply circuit for providing a first power supply voltage to the first signal path;
a second die lying within a first geometric plane, the second die comprising a second switch circuit coupled to a second signal path, wherein the second switch circuit comprises a second voltage supply circuit for providing, independently from the first voltage supply circuit, a second power supply voltage to the second signal path;
first means for controlling the first switch circuit to control the second switch and dynamically couple at least one of the first and second power supply voltage from the first signal path to the second switch circuit; and
second means for controlling the second switch circuit to dynamically couple at least one of the first and second power supply voltage to the second signal path.

30. The apparatus of claim 29, wherein the first means and the second means are configured to dynamically control a test signal for the first circuit and the second circuit using the first signal path, the second signal path, and a third signal path between the first switch circuit and the second switch circuit.

31. The integrated circuit of claim 1, wherein the first switch circuit and the second switch circuit are configured to dynamically control a test signal for the first circuit and the second circuit using the first signal path, the second signal path, and the third signal path.

32. The integrated circuit of claim 12, wherein the first switch circuit and the second switch circuit are configured to dynamically control a test signal for the first circuit and the second circuit using the first signal path, the second signal path, and the third signal path.

33. The method of claim 21, further comprising:
controlling the first switch circuit via the first circuit to dynamically route a test signal to the second switch circuit; and
controlling the second switch circuit via a second circuit to dynamically route the test signal to the second signal path.

\* \* \* \* \*